(12) United States Patent
Miura et al.

(10) Patent No.: US 9,306,051 B2
(45) Date of Patent: Apr. 5, 2016

(54) SEMICONDUCTOR DEVICE USING A NITRIDE SEMICONDUCTOR

(71) Applicant: Renesas Electronics Corporation, Kawasaki-shi, Kanagawa (JP)

(72) Inventors: Yoshinao Miura, Kanagawa (JP); Tatsuo Nakayama, Kanagawa (JP); Takashi Inoue, Kanagawa (JP); Hironobu Miyamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/590,433

(22) Filed: Jan. 6, 2015

(65) Prior Publication Data
US 2015/0221758 A1 Aug. 6, 2015

(30) Foreign Application Priority Data
Feb. 6, 2014 (JP) ................. 2014-021247

(51) Int. Cl.
*H01L 29/778* (2006.01)
*H01L 29/423* (2006.01)
(Continued)

(52) U.S. Cl.
CPC ........ *H01L 29/7787* (2013.01); *H01L 29/1087* (2013.01); *H01L 29/201* (2013.01); *H01L 29/2003* (2013.01); *H01L 29/205* (2013.01); *H01L 29/4175* (2013.01); *H01L 29/4236* (2013.01); *H01L 29/66462* (2013.01); *H01L 29/7783* (2013.01); *H01L 29/41758* (2013.01)

(58) Field of Classification Search
None
See application file for complete search history.

(56) References Cited

U.S. PATENT DOCUMENTS 7,884,395 B2 2/2011 Saito
7,939,391 B2 5/2011 Suh et al.
(Continued)

FOREIGN PATENT DOCUMENTS

JP 2007-103451 A 4/2007
JP 2007-128994 A 5/2007
(Continued)

OTHER PUBLICATIONS

Nienhaus, H., M. Schneider, S.p. Grabowski, W. Mönch, R. Dimitrov, O. Ambacher, and M. Stutzmann. "Ionization Energy and Electron Affinity of Clean and Oxidized AlxGa1—xN(0001) Surfaces." MRS Proc. MRS Proceedings 680 (2001).*

(Continued)

*Primary Examiner* — Joseph Schoenholtz
(74) *Attorney, Agent, or Firm* — Sughrue Mion, PLLC

(57) ABSTRACT

To provide a semiconductor device having improved characteristics. The semiconductor device has, over a substrate thereof, a first buffer layer (GaN), a second buffer layer (AlGaN), a channel layer, and a barrier layer, a trench penetrating through the barrier layer and reaching the middle of the channel layer, a gate electrode placed in the trench via a gate insulating film, and a source electrode and a drain electrode formed on both sides of the gate electrode respectively. By a coupling portion in a through-hole reaching the first buffer layer, the buffer layer and the source electrode are electrically coupled to each other. Due to a two-dimensional electron gas produced in the vicinity of the interface between these two buffer layers, the semiconductor device can have an increased threshold voltage and improved normally-off characteristics.

20 Claims, 24 Drawing Sheets

(51) Int. Cl.

| | | |
|---|---|---|
| *H01L 29/205* | (2006.01) | |
| *H01L 29/20* | (2006.01) | |
| *H01L 29/201* | (2006.01) | |
| *H01L 29/417* | (2006.01) | |
| *H01L 29/66* | (2006.01) | |
| *H01L 29/10* | (2006.01) | |

(56) References Cited

U.S. PATENT DOCUMENTS

| | | | |
|---|---|---|---|
| 2005/0145851 A1 | 7/2005 | Johnson et al. | |
| 2009/0206371 A1 | 8/2009 | Oka | |
| 2011/0012173 A1* | 1/2011 | Umeda et al. | 257/192 |
| 2011/0227093 A1* | 9/2011 | Hikita et al. | 257/76 |
| 2011/0272708 A1* | 11/2011 | Yoshioka et al. | 257/77 |
| 2013/0043484 A1 | 2/2013 | Curatola et al. | |
| 2015/0076508 A1* | 3/2015 | Saito et al. | 257/76 |
| 2015/0076511 A1* | 3/2015 | Okamoto et al. | 257/76 |
| 2015/0171204 A1* | 6/2015 | Nakayama et al. | 257/76 |

FOREIGN PATENT DOCUMENTS

| | | |
|---|---|---|
| JP | 2009-9993 A | 1/2009 |
| JP | 2009-200096 A | 9/2009 |

OTHER PUBLICATIONS

Choi, Woojin, Ogyun Seok, Hojin Ryu, Ho-Young Cha, and Kwang-Seok Seo. "High-Voltage and Low-Leakage-Current Gate Recessed Normally-Off GaN MIS-HEMTs With Dual Gate Insulator Employing PEALD-SiNx / RF-Sputtered HfO2" IEEE Electron Device Lett. IEEE Electron Device Letters 35.2 (2014): 175-77.*

Reliability issues of GaN based high voltage power devices; Microelectronics and Reliability, Elsevier Science Ltd, GB, vol. 51, No. 9, pp. 1710-1716, Date Jul. 5, 2011.

Individual Source Vias for GaN HEMT Power Bars, European Microwave Integrated Circuit Conference, European Microwave Association, pp. 184-187, Date Oct. 6, 2013.

European Office Action issued in Application No. 15150397.6-1552, Dated Feb. 3, 2016.

* cited by examiner

SEMICONDUCTOR DEVICE USING A NITRIDE SEMICONDUCTOR

CROSS-REFERENCE TO RELATED APPLICATIONS

The disclosure of Japanese Patent Application No. 2014-021247 filed on Feb. 6, 2014 including the specification, drawings, and abstract is incorporated herein by reference in its entirety.

BACKGROUND

The present invention relates to a semiconductor device and is suited for use, for example, in a semiconductor device using a nitride semiconductor.

Since a nitride semiconductor such as gallium nitride (GaN) has a band gap greater than that of silicon (Si) and has a great critical electric field, a high-breakdown-voltage and low-loss power device is likely to be realized. Such a power device is however a normally-on type so that a gate structure providing the device with normally-off characteristics is under investigation.

For example, Patent Document 1 (Japanese Unexamined Patent Application Publication No. 2009-9993) discloses a semiconductor device having, on a silicon pin diode thereof, an HEFT using an AlGaN/GaN heterojunction structure. The source electrode of this semiconductor device is coupled to a p type silicon layer via a trench penetrating through a barrier layer, a channel layer, and a buffer layer and reaching the p type silicon layer.

Patent Document 2 (Japanese Unexamined Patent Application Publication No. 2007-103451) discloses a normally-off type semiconductor device having a stacked portion comprised of an $Al_{0.2}Ga_{0.8}N$ layer, a GaN layer, and an InGaN layer.

Patent Document 3 (Japanese Unexamined Patent Application Publication No. 2009-200096) discloses a nitride semiconductor device featuring a small leakage current produced when a high bias voltage is applied and a small loss when the device is turned off.

PATENT DOCUMENTS

[Patent Document 1] Japanese Unexamined Patent Application Publication No. 2009-9993
[Patent Document 2] Japanese Unexamined Patent Application Publication No. 2007-103451
[Patent Document 3] J Japanese Unexamined Patent Application Publication No. 2009-200096

SUMMARY

The present inventors have been engaged in research and development of semiconductor devices using a nitride semiconductor as described above and have carried out an intensive investigation on improvement of their characteristics. In particular, they have carried out an intensive investigation on gate leakage reduction, improvement of normally-off characteristics, and the like. During investigation, it has been found that there is room for further improvement in the characteristics of a semiconductor device using a nitride semiconductor.

Another problem and novel features will be apparent from the description herein and accompanying drawings.

Typical embodiments, among embodiments disclosed herein, will next be outlined simply.

A semiconductor device shown in First Embodiment disclosed herein has a first nitride semiconductor layer, a second nitride semiconductor layer, a third nitride semiconductor layer, and a fourth nitride semiconductor layer, each formed over a substrate. It further has a gate electrode placed over the third nitride semiconductor layer and a first electrode and a second electrode formed respectively on both sides of the gate electrode. The first nitride semiconductor layer is coupled to the first electrode.

Semiconductor devices disclosed herein and shown in the following typical embodiments can have improved characteristics.

DETAILED DESCRIPTION

Figure 1:
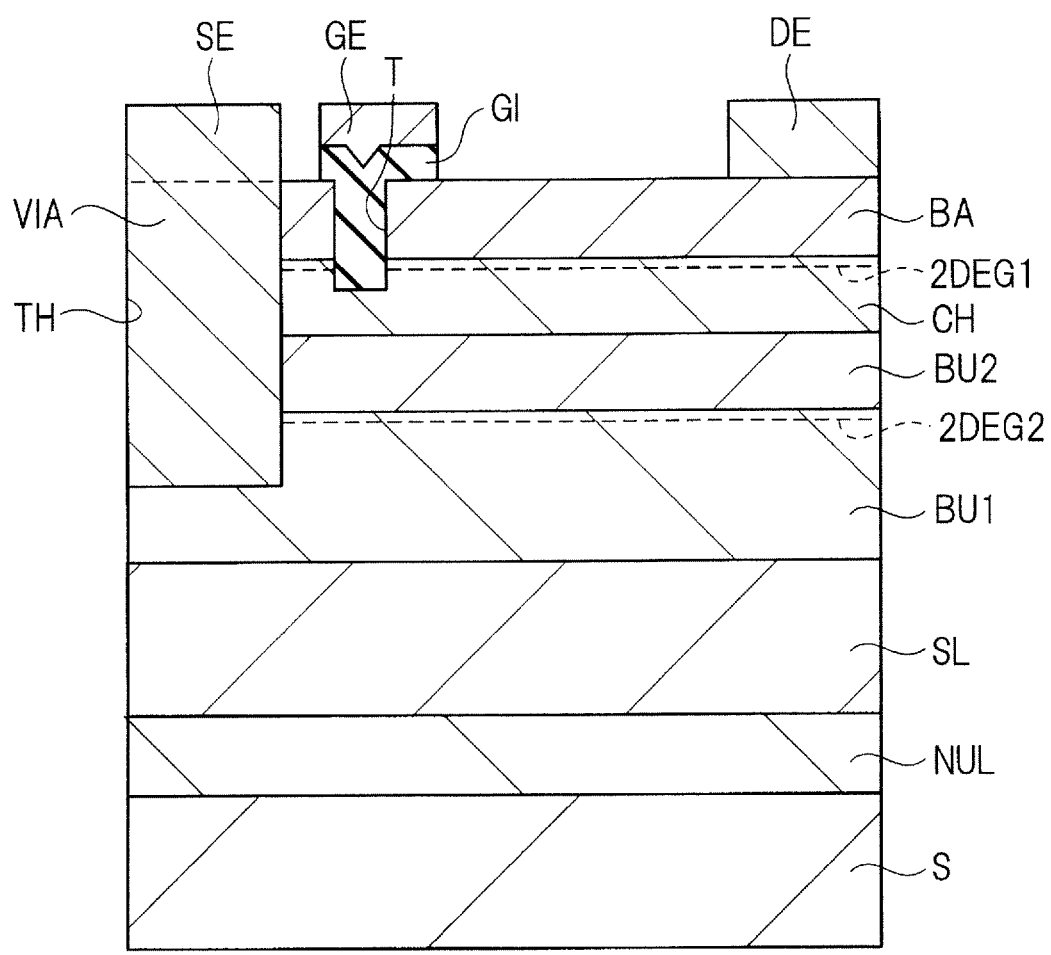
FIG. 1 is a cross-sectional view schematically showing the configuration of a semiconductor device of First Embodiment.

In the following embodiments, a description may be made after divided in a plurality of sections or embodiments if necessary for the sake of convenience. These sections or embodiments are not independent from each other unless otherwise particularly specified, but one of them may be a modification example, application example, detailed description, complementary description, or the like of a part or whole of the other one. In the following embodiments, when a reference is made to the number of elements (including the number, value, amount, range, or the like), the number is not limited to the specific number but may be more or less than the specific number, unless otherwise particularly specified or principally apparent that the number is limited to the specific number.

Further, in the following embodiments, the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to it is also embraced unless otherwise particularly specified or principally apparent that it is not. This also applies to the above-mentioned number (including the number, value, amount, range, or the like).

Embodiments will hereinafter be described in detail based on drawings. In all the drawings for describing the embodiments, members having the same function will be identified by the same or like reference numerals and overlapping descriptions will be omitted. When there is a plurality of members (sites) similar to each other, a symbol may be added to the reference numeral representing a generic term in order to show an individual or specific site. In the following embodiments, a description on the same or similar portion is not repeated in principle unless otherwise particularly necessary.

In the drawings to be used in the following embodiments, even a cross-sectional view is sometimes not hatched to facilitate understanding of it or even a plan view may be hatched to facilitate understanding of it.

In the cross-sectional view and plan view, the dimensions of each site do not correspond to those of an actual device. To facilitate understanding of them, the dimensions of a particular site may be enlarged relatively. Even when a cross-sectional view and a plan view correspond to each other, the dimensions of a particular site may be enlarged relatively to facilitate understanding of the drawing.

First Embodiment

The semiconductor device of the present embodiment will next be described specifically referring to drawings.
[Description on Structure]

FIG. 1 is a cross-sectional view schematically showing the configuration of the semiconductor device of the present embodiment. The semiconductor device (semiconductor element) of the present embodiment shown in FIG. 1 is an MIS (metal insulator semiconductor) type field effect transistor (FET) using a nitride semiconductor. This semiconductor device can be used as a high electron mobility transistor (HEMT) type power transistor. The semiconductor device of the present embodiment is a so-called recess gate type semiconductor device.

The semiconductor device of the present embodiment has, on a substrate S thereof, a nucleus formation layer NUL, a superlattice layer, a buffer layer BU1, a buffer layer BU2, a channel layer (also called "electron running layer") CH, and a barrier layer BA formed in order of mention.

The nucleus formation layer NUL is made of a nitride semiconductor layer. The superlattice layer SL is made of a plurality of nitride semiconductor layers. The buffer layer BU1 is made of a nitride semiconductor layer and the buffer layer BU2 is made of a nitride semiconductor layer having an electron affinity smaller than that of the buffer layer BU1. The channel layer CH is made of a nitride semiconductor layer having an electron affinity greater than that of the buffer layer BU2. The barrier layer BA is made of a nitride semiconductor layer having an electron affinity smaller than that of the channel layer CH.

As the substrate S, for example, a substrate ($p^+Si$ substrate) made of Si (silicon) containing a p type impurity can be used. Instead of the above-mentioned substrate made of silicon, a substrate made of a nitride semiconductor such as GaN may be used as the substrate S. A substrate made of AlN, SiC, sapphire, or the like may also be used.

The nucleus formation layer NUL is formed so as to generate crystal nuclei upon growth of a layer to be formed thereover such as the superlattice layer SL. As the nucleus formation layer NUL, for example, an aluminum nitride (AlN) layer can be used. The nucleus formation layer NUL can be omitted when a GaN substrate is used as the substrate S.

The superlattice layer SL is formed to improve the crystallinity of a nitride semiconductor to be formed thereover and at the same time, relax a film stress of the nitride semiconductor to be stacked. As the superlattice layer SL, a superlattice structure obtained by stacking, over a plurality of cycles, a stacked film (AlN/GaN film) of a gallium nitride (GaN) layer and an aluminum nitride (AlN) layer.

The buffer layer BU1 is made of a nitride semiconductor layer, for example, a GaN layer. The GaN layer has a thickness of, for example, about 100 nm.

The buffer layer BU2 is made of a nitride semiconductor layer having an electron affinity smaller than that of the buffer layer BU1. The buffer layer BU2 is made of, for example, an AlGaN layer. The AlGaN layer has a thickness of, for example, about 1000 nm.

The channel layer CH is made of a nitride semiconductor layer having an electron affinity greater than that of the buffer layer BU2. The channel layer CH is made of, for example, a GaN layer. The GaN layer has a thickness of, for example, about 50 nm.

The barrier layer BA is made of a nitride semiconductor layer having an electron affinity smaller than that of the channel layer CH. The barrier layer BA is made of, for example, an AlGaN layer. The AlGaN layer has a thickness of, for example, about 15 nm and the Al content is, for example, about 20% ($Al_{0.2}Ga_{0.8}N$).

The MISFET of the present embodiment has, over the channel layer CH thereof, a gate electrode GE formed via a gate insulating film GI and a source electrode SE and a drain electrode DE placed on both sides of the gate electrode GE, respectively. The drain electrode DE is placed on the barrier layer BA and the source electrode SE is placed on a coupling portion VIA. The gate electrode GE lies, via the gate insulating film CI, in a trench (also called "groove" or "recess") T penetrating through the barrier layer BA and reaching the middle of the channel layer CH.

As the gate insulating film GI, for example, an aluminum oxide ($Al_2O_3$) film can be used. The aluminum oxide film has a thickness of, for example, about 50 nm.

As the gate electrode GE, for example, a titanium nitride (TiN) film can be used. The titanium nitride film has a thickness of, for example, about 200 nm.

As the source electrode SE and the drain electrode DE, for example, a stacked film obtained by stacking an Al film on a TiN film can be used. The TiN film has a thickness of, for example, about 50 nm and the Al film has a thickness of, for example, about 1000 nm. As a material of the source electrode SE and the drain electrode DE, any material capable of forming an ohmic contact with the underlying nitride semiconductor layer can be used.

As the coupling portion VIA, similar to the above-mentioned source electrode SE and the drain electrode DE, a stacked film obtained by stacking an Al film on a TiN film can be used. The TiN film has a thickness of, for example, about 50 nm and the Al film has a thickness of, for example, about 1000 nm. As a material configuring the coupling portion VIA, any material capable of forming an ohmic contact with the nitride semiconductor layer placed on the bottom portion of the through-hole TH can be used. A main element Al configuring the source electrode SE, the drain electrode DE, and the coupling portion VIA forms an ohmic contact with a nitride semiconductor layer to which it is contiguous by heat treatment (however, up to 550° C.) performed after formation of the Al film.

Figure 5:
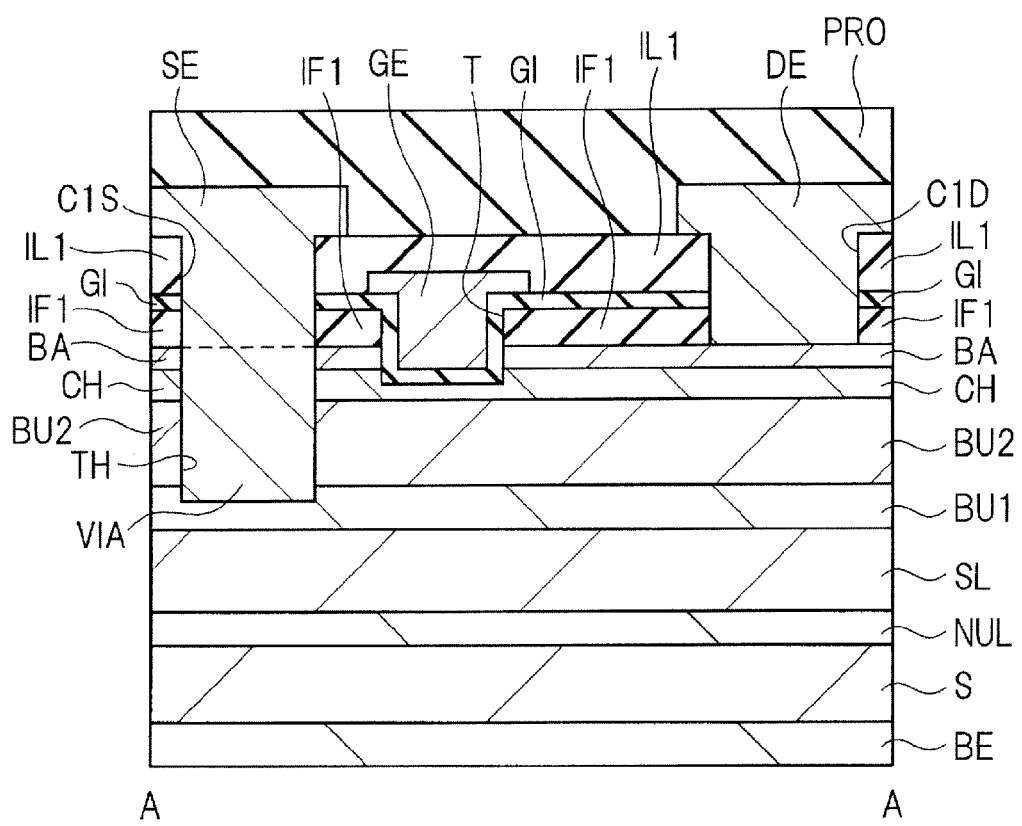
FIG. 5 is a cross-sectional view showing the configuration of the semiconductor device of First Embodiment.

The gate electrode GE has thereon an interlayer insulating film, and the source electrode SE, the drain electrode DE, and the interlayer insulating film have thereon a protective film (refer to FIG. 5). As the interlayer insulating film, for example, an insulating film such as silicon oxide film can be used, while as the protective film, an insulating film such as a silicon oxynitride (SiON) film can be used.

One operation example of such a MISFET will next be described. For example, when it is turned ON by applying a gate bias sufficiently to the positive side, an electric current flows with electrons accumulated immediately below the gate electrode GE as a carrier. Between a source electrode SE portion and a gate electrode GE portion, and between the gate electrode GE portion and a drain electrode DE portion, a current flows with a high mobility two-dimensional electron gas 2DEG1, generated at the interface between the barrier layer BA and the channel layer CH, as a carrier. When it is turned OFF by applying a gate bias sufficiently to the negative side, it can endure a high voltage during application of the high voltage between a source and a drain because of depletion of the two-dimensional electron gas 2DEG1. A threshold gate voltage at the time of switchover from OFF state to ON state is an important parameter and here, it is defined by a drain current (1E−5 A/mm) per unit area.

According to the present embodiment, a stacked portion of the buffer layer BU1 and the buffer layer BU2 having an electron affinity smaller than that of the buffer layer BU1 is provided below the channel layer CH and the coupling portion VIA reaching a position lower than the interface between these buffer layers and to be coupled to the source electrode SE is provided. This enables the coupling portion VIA to bring the potential of the buffer layer BU1 close to a source potential (for example, ground potential) and also enables production of a two-dimensional electron gas 2DEG2 at the interface between the buffer layer BU1 and the buffer layer BU2. As a result, as will be described later, an increase in threshold voltage and improvement in normally-off characteristics can be achieved.

Figure 2:
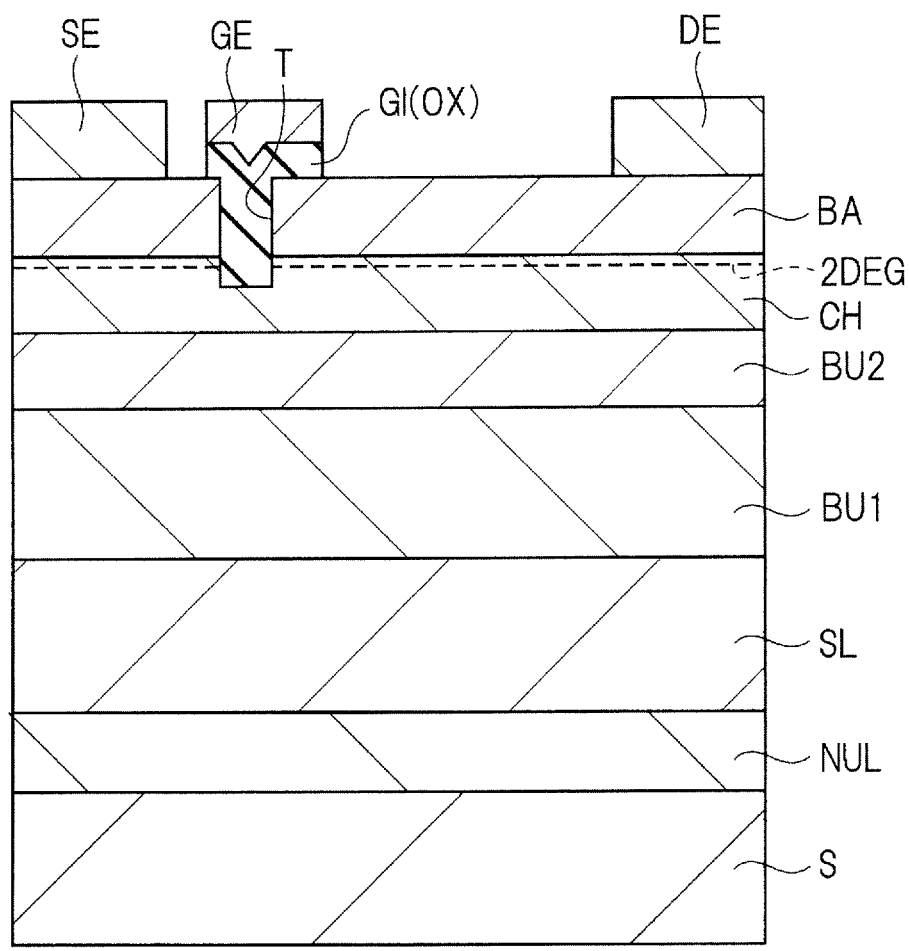
FIG. 2 is a cross-sectional view showing the configuration of a semiconductor device (MISFET) of Comparative Example.
Figure 3:
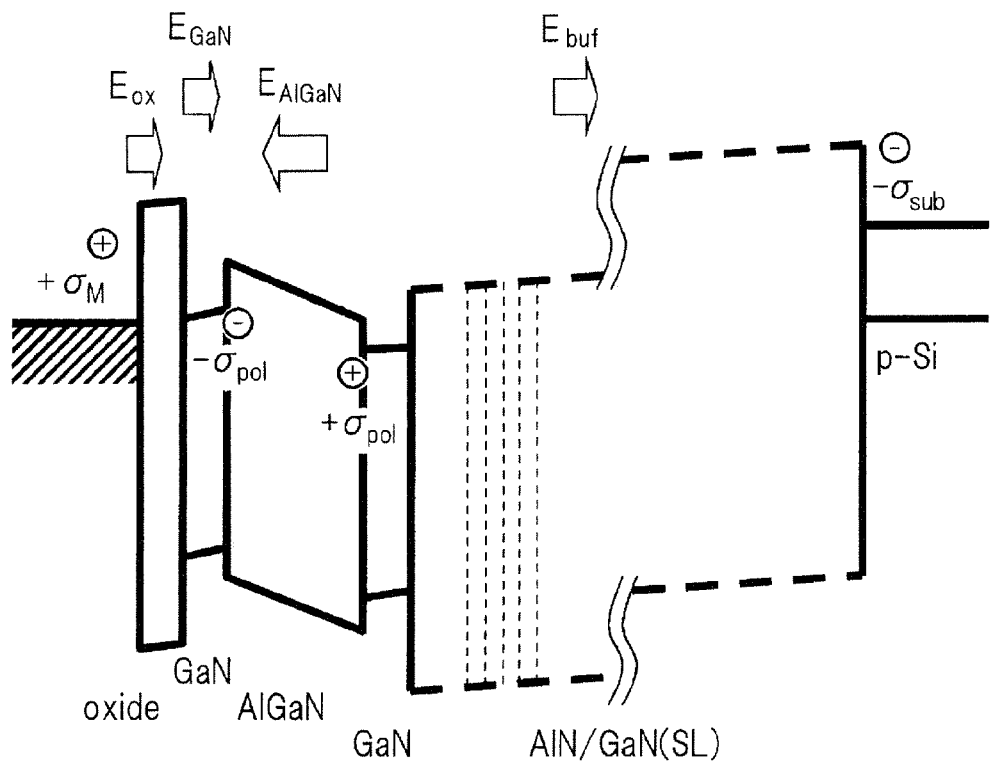
FIG. 3 is a band diagram in the depth direction of a gate electrode portion of the semiconductor device (MISFET) of Comparative Example.
Figure 4:
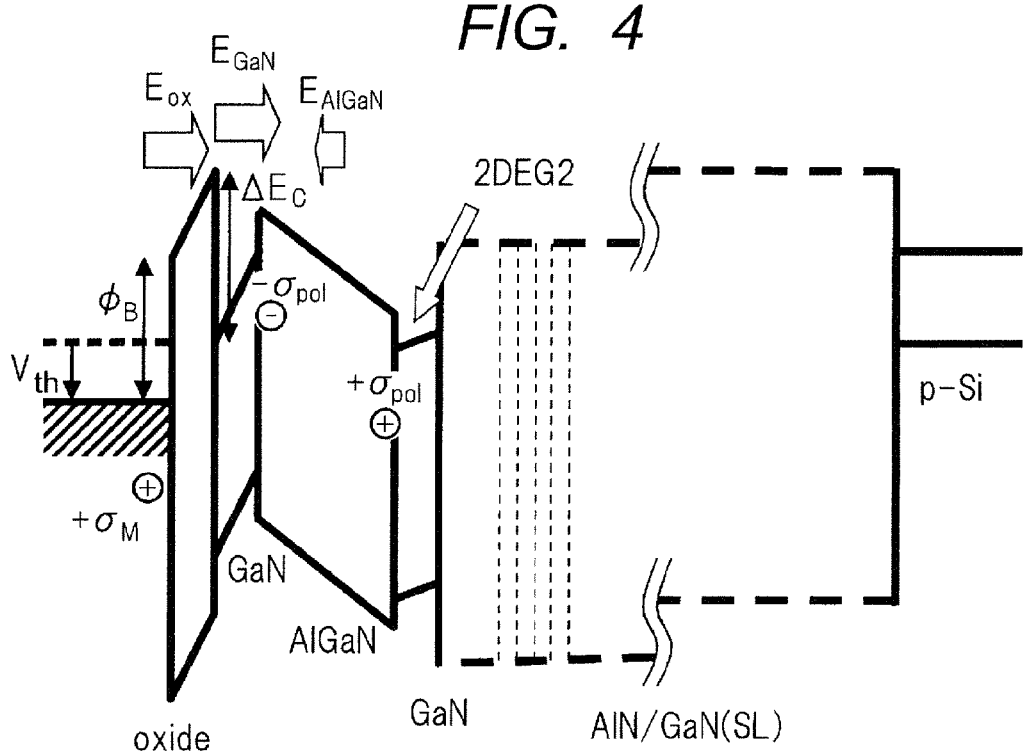
FIG. 4 is a band diagram in the depth direction of a gate electrode portion of the semiconductor device (MISFET) of First Embodiment when a gate voltage is set at a threshold voltage.

FIG. 2 is a cross-sectional view showing the configuration of a semiconductor device (MISFET) of Comparative Example. The semiconductor device of Comparative Example shown in FIG. 2 is not equipped with the coupling portion VIA. FIG. 3 is a band diagram in the depth direction of a gate electrode portion of the semiconductor device (MISFET) of Comparative Example. FIG. 4 is a band diagram in the depth direction of a gate electrode portion when the gate voltage of the semiconductor device (MISFET) of First Embodiment is set at a threshold voltage and shows involvement of the two dimensional electron gas 2DEG2.

An increase in threshold voltage is suppressed inevitably as shown in FIG. 3 when the coupling portion VIA is not provided as shown in FIG. 2.

Described specifically, since as shown in FIG. 3, a negative polarization charge (−σpol) present at the interface between the channel layer (GaN) CH and the buffer layer (AlGaN) BU2 lifts up the potential of electrons, it is effective for suppressing a leakage current and increasing the threshold voltage. When the buffer layer (AlGaN) BU2 has thereunder a nitride semiconductor layer (meaning the buffer layer (GaN) BU1 here) having an electron affinity smaller than that of the buffer layer (AlGaN) BU2, however, a positive polarization charge (+σpol) similar in magnitude to that of the above-mentioned negative polarization charge (−σpol) is present and it offsets therewith the negative polarization charge (−σpol), making it impossible to achieve an expected increase in threshold voltage. In such a manner, an increase in threshold voltage is suppressed.

As shown in FIG. 4, on the other hand, when a two dimensional electron gas 2DEG2 is produced at the interface between the buffer layer (AlGaN) BU2 and the buffer layer (GaN) BU1, the positive polarization charge (+σpol) is offset with this two dimensional electron gas 2DEG2, leading to a drastic decrease in net charge at the interface between the buffer layer (GaN) BU1 and the buffer layer (AlGaN) BU2. As a result, the negative polarization charge (−σpol) present at the interface between the channel layer (GaN) CH and the buffer layer (AlGaN) BU2 is not offset and an increase in threshold voltage and improvement in normally off characteristics can be achieved.

Conditions suited for effectively causing a threshold-value increasing effect will next be described referring to FIG. 4.

The negative polarization charge $-\sigma\text{pol}$ ($\sigma\text{pol}>0$) present at the interface between the channel layer (GaN) CH and the buffer layer (AlGaN) BU2 attracts a positive counter charge ($+\sigma_M$) to the side of the gate electrode GE without applying an external voltage. An electric field EGaN extending from the side of the gate electrode GE to the negative polarization charge is therefore produced. The band line-up when the gate voltage Vg agrees with the threshold voltage Vth is as shown in FIG. 4. Unless the gate insulating film has a charge inside or at the interface thereof, an electric field Eox in the gate insulating film is determined by the following relational equation (Equation 1):

$$\in_{GaN} \cdot EGaN = \in_{ox} \cdot Eox \quad \text{(Equation 1)}$$

wherein $\in_{GaN}$ represents a specific dielectric constant of GaN and $\in_{ox}$ represents a specific dielectric constant of the gate insulating film.

At this time, a built-in voltage Vox ($=Eox\cdot tox$) is applied to the gate insulating film having a thickness tox and a threshold voltage increases by this built-in voltage. The threshold voltage Vth can be expressed by the following relational equation (Equation 2):

$$Vth = \phi B + Eox \cdot tox - \Delta EC \quad \text{(Equation 2)}$$

wherein a barrier height with respect to a metal configuring the gate electrode is represented by $\phi B$ and a band discontinuity between the gate insulating film and the channel layer (GaN) CH is represented by DEC.

Equation 1 is then substituted into Equation (2) to obtain the following rational equation (Equation 3) in which the threshold voltage Vth is a function of the electric field EGaN of the channel layer (GaN) CH.

$$Vth = \phi B + (\in_{GaN}/\in_{ox}) \cdot EGaN \cdot tox - \Delta EC \quad \text{(Equation 3)}$$

Equation 3 shows that with an increase in the electric field EGaN of the channel layer (GaN) CH, the threshold voltage Vth increases to the more positive side.

Next, a relationship between the electric field EGaN and the negative polarization charge $-\sigma\text{pol}$ ($\sigma\text{pol}>0$) is shown. In the following equation, "$\sigma\text{pol}$" is simply represented by "$\sigma p$". Application of Gauss's law to the interface between the channel layer (GaN) CH and the buffer layer (AlGaN) BU2 leads to the following rational equation (Equation 4).

$$\sigma p = \in_{GaN} \cdot EGaN + \in_{AlGaN} \cdot EAlGaN \quad \text{(Equation 4)}$$

Since a potential drop in the channel layer (GaN) CH and that in the buffer layer (AlGaN) BU2 are equal to each other, the following rational equation (Equation 5) can be obtained.

$$tGaN \cdot EGaN = tAlGaN \cdot EAlGaN \quad \text{(Equation 5)}$$

Then, elimination of EAlGaN from Equation 4 and Equation 5 leads to the following rational equation (Equation 6).

$$EGaN = tAlGaN \cdot \sigma p / (tAlGaN \cdot \in_{GaN} + tGaN \cdot \in_{AlGaN}) \quad \text{(Equation 6)}$$

It is known that with an increase in the Al concentration of the buffer layer (AlGaN) BU2, the absolute value op of the negative polarization charge becomes greater. It is therefore apparent from Equation 3 and Equation 6 that with an increase in the Al concentration, the threshold voltage Vth becomes higher. A description on this Al concentration will be made later (refer to FIGS. 13 and 14).

It is also apparent from Equation 6 that the greater a (thickness of the buffer layer)/(thickness of the channel layer) ratio (tAlGaN/tGaN), the greater the threshold-voltage increasing effect. Equation 3 shows that in EGaN>0, the greater the thickness tox of the gate insulating film, the higher the threshold voltage, but it is desired to form a gate insulating film having the minimum thickness satisfying a necessary gate breakdown endurance because the gate driving capacity decreases with an increase in the tox.

Thus, the negative polarization charge causes an electric field both on the side of the gate electrode GE and on the side of the substrate S. A ratio of these electric fields is determined in reverse proportion to the (thickness of the buffer layer (AlGaN) BU)/(thickness of the channel layer (GaN) CH) ratio so that the thickness of the buffer layer (AlGaN) BU2 is made greater in order to enhance the threshold-voltage increasing effect. For example, the buffer layer (AlGaN) BU2 is preferably made thicker than the channel layer (GaN) CH. The buffer layer (AlGaN) BU2 is more preferably made thicker by 10 times or more than the channel layer (GaN) CH.

It is to be noted that the above-mentioned two dimensional electron gas 2DEG2 is not necessarily produced in a steady state. For example, generation of the two dimensional electron gas 2DEG2 until the gate voltage Vg reaches the threshold voltage Vth due to an increase in the gate voltage Vg has the threshold-voltage increasing effect.

Figure 6:
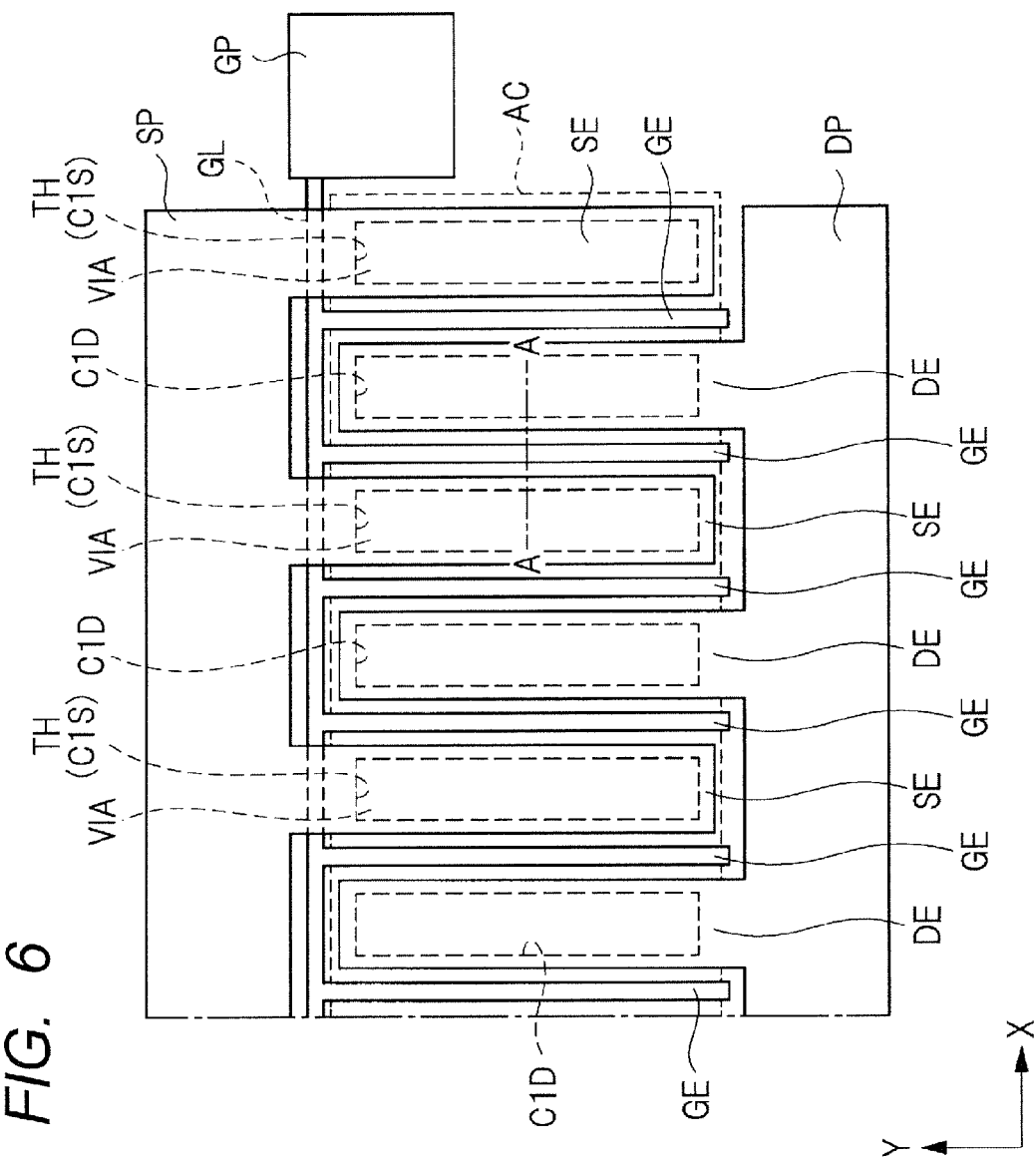
FIG. 6 is a plan view showing the configuration of the semiconductor device of First Embodiment.

The semiconductor device of First Embodiment will be described in further detail while referring to FIGS. 5 and 6. FIG. 5 is a cross-sectional view showing the configuration of the semiconductor device of the present embodiment. FIG. 6 is a plan view showing the configuration of the semiconductor device of the present embodiment. FIG. 5 corresponds to the cross-section A-A of FIG. 6.

In the semiconductor device shown in FIG. 5 similar to the semiconductor device shown in FIG. 1, a substrate S has thereover a nucleus formation layer NUL, a superlattice layer SL, a buffer layer BU1, a buffer layer BU2, a channel layer CH, and a barrier layer BA in order of mention. The barrier layer BA has thereon an insulating film IF1.

This semiconductor device has, over the channel layer CH thereof, a gate electrode GE formed via a gate insulating film GI and a source electrode SE and a drain electrode DE formed, respectively, on both sides of the gate electrode GE. The gate electrode GE lies, via the gate insulating film GI, in a trench T penetrating through the insulating film IF1 and the barrier layer BA and reaching the middle of the channel layer CH. The gate electrode GE has thereon an interlayer insulating film IL1.

The source electrode SE has thereunder a through-hole (also called "pore", "hole", or "recess") TH. This through-hole TH is filled with a conductive film and configures a coupling portion VIA. As described above, the coupling portion VIA is coupled (ohmically coupled) to the buffer layer BU1.

The source electrode SE and the drain electrode DE have thereon a protective film (also called "passivation film", "insulating film", "cover film", or "surface protective film") PRO.

The substrate S has, on the back side thereof, a back surface electrode BE.

As shown in FIG. 6, the drain electrode DE has a rectangular planar shape having a long side in the direction Y. A plurality of linear drain electrodes DE are placed in the direction X with a predetermined interval. The source electrode SE has a rectangular planar shape having a long side in the direction Y. A plurality of linear source electrodes SE are placed in the direction X with a predetermined interval. Each of the source electrodes SE and each of the drain electrodes DE are placed alternately along the direction X The drain electrode DE has thereunder a contact hole C1D which will be a coupling portion between the drain electrode DE and the barrier layer BA. The contact hole C1d has a rectangular planar shape having a long side in the direction Y. The source electrode SE has thereunder a through-hole TH (coupling portion VIA). The through-hole TH (coupling portion VIA) has a rectangular planar shape having a long side in the direction Y.

The drain electrode DE and the source electrode SE have therebetween a gate electrode GE. The gate electrode GE has a rectangular shape having a long side in the direction Y.

The drain electrodes DE are coupled to each other via a drain pad (also called "terminal portion") DP. The drain pad DP is placed so as to extend in the direction X on the side of one end (on the lower side in FIG. 6) of the drain electrode DE. In other words, the drain electrodes DE are placed so as to protrude in the direction Y from the drain pad DP extending in the direction X. Such a shape is sometimes called "comb shape".

The source electrodes SE are coupled to each other via a source pad (also called "terminal portion") SP. The source pad SP is placed so as to extend in the direction X on the side of the other end (on the upper side in FIG. 6) of the source electrodes SE. In other words, the source electrodes SE are placed so as to protrude in the direction Y from the source pad SP extending in the direction X. Such a shape is sometimes called "comb shape".

The gate electrodes GE are coupled to each other gate via a gate line GL. This gate line GL is placed so as to extend in the direction X on the side of one end of the gate electrode GE (on the upper side in FIG. 6). In other words, the gate electrodes GE are placed so as to protrude in the direction Y from the gate line GL extending in the direction X. The gate line GL is coupled to, for example, a gate pad GP provided on both sides (only the gate pad on the right side is shown in FIG. 6) in the direction X of the gate line GL.

The source electrode SE, the drain electrode DE, and the gate electrode GE are placed mainly on an active region AC surrounded with an element isolation region (ISO). The active region AC has a rectangular planar shape having a long side in the direction X. On the other hand, the drain pad DP, gate line GL, and the source pad SP are placed on the element isolation region (ISO). The active region AC and the source pad SP have therebetween the gate line GL.

The source electrode SE has thereunder a through-hole (also called "pore", "hole", or "recess") TH. This through-hole TH is filled with a conductive film and they configure a coupling portion VIA. As described above, the coupling portion VIA is coupled to the buffer layer BU1.

As described above, the coupling portion VIA and the source pad SP, and the drain pad DP are integrated respectively with the source electrode SE and the drain electrode DE. The source pad SP and the drain pad DP are therefore made of the same material as that of the source electrode SE and the drain electrode DE.

[Description on Manufacturing Method]

Next, referring to FIGS. 7 to 12, a method of manufacturing the semiconductor device of the present embodiment will be described and at the same time, the configuration of the semiconductor device will be made clearer. FIGS. 7 to 12 are cross-sectional views showing manufacturing steps of the semiconductor device of the present embodiment.

Figure 7:
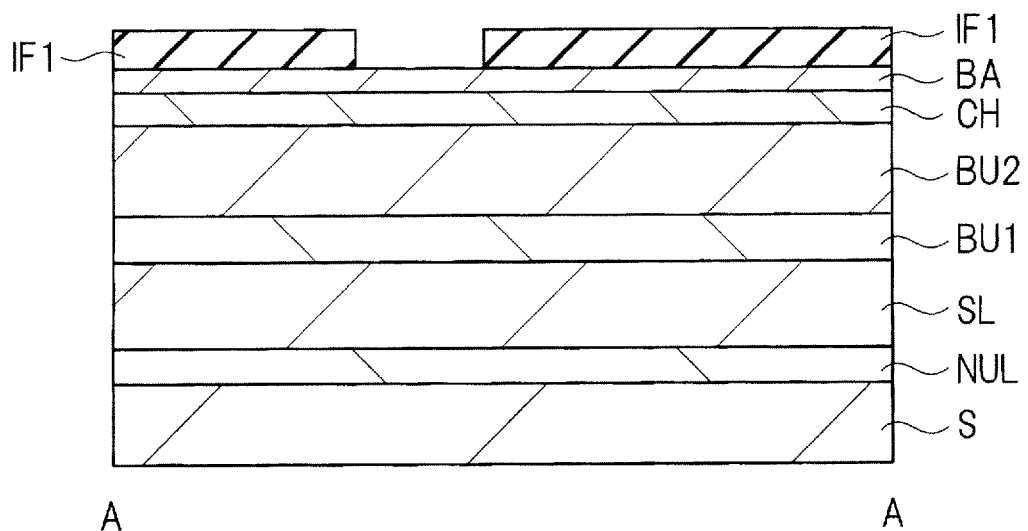
FIG. 7 is a cross-sectional view showing a manufacturing step of the semiconductor device of First Embodiment.

As shown in FIG. 7, a nucleus formation layer NUL and a superlattice layer L are formed on a substrate S successively. As the substrate S, for example, a semiconductor substrate made of silicon (Si) having an exposed (111) plane is used and as the nucleus formation layer NUL, for example, an aluminum nitride (AlN) layer having a thickness of about 200 nm is hetero-epitaxially grown on the substrate through metal organic chemical vapor deposition (MOCVD) or the like.

As the substrate S, not only the above-mentioned silicon but also a substrate made of SiC or sapphire may be used. Further, typically, the nucleus formation layer NUL and nitride semiconductor layers (group III-V compound semiconductor layers) formed after and the nucleus formation layer NUL are all formed by the group III element plane growth (meaning gallium plane growth or aluminum plane growth in the present embodiment).

Next, on the nucleus formation layer NUL, a superlattice structure is formed as the superlattice layer SL by stacking a stacked film (AlN/GaN film) of a gallium nitride (GaN) layer and an aluminum nitride (AlN) layer in repetition. For example, a gallium nitride (GaN) layer of about 20 nm thick and an aluminum nitride (AlN) layer of about 5 nm thick are hetero-epitaxially grown alternately through metal organic vapor phase deposition or the like. For example, 40 layers of the stacked film are formed. This stacked film may be grown while doping with carbon (C).

Next, as a buffer layer BU1, a gallium nitride layer (i-GaN layer) is hetero-epitaxially grown on the superlattice layer SL through metal organic vapor phase deposition or the like. At this time, it is grown without intentional doping with an impurity. The buffer layer BU1 has a thickness of, for example, about 100 nm. As the buffer layer BU1, a gallium nitride layer (p-GaN layer) containing a p type impurity may be used instead.

Next, as a buffer layer BU2, an AlGaN layer is hetero-epitaxially grown on the buffer layer BU1 through metal organic vapor deposition or the like. It is grown without intentional impurity doping. The buffer layer BU2 has a thickness of, for example, about 1000 nm.

Next, a channel layer CH is formed on the buffer layer BU2. For example, a gallium nitride layer is hetero-epitaxially grown on the buffer layer BU2 through metal organic chemical vapor deposition or the like. At this time, it is grown without intentional impurity doping. The resulting channel layer CH has a film thickness of, for example, about 50 nm.

Next, as a barrier layer BA, for example, an AlGaN layer is hetero-epitaxially grown on the channel layer CH through metal organic vapor phase deposition or the like. For example, Al and Ga contents are set respectively at 0.2 and 0.8 to form an $Al_{0.2}Ga_{0.8}N$ layer. The Al content in the AlGaN layer formed as the barrier layer BA is made greater than the Al content in the AlGaN layer formed as the buffer layer BU2.

In such a manner, the stacked film of the buffer layer BU1, the buffer layer BU2, the channel layer CH, and the barrier layer BA is formed. In the stacked film, as described above, a two-dimensional electron gas (2DEG2) is produced in the vicinity of the interface between the buffer layer BU1 and the buffer layer BU2, while a two-dimensional electron gas (2DEG1) is produced in the vicinity of the interface between the channel layer CH and the barrier layer BA (refer to FIG. 1).

Next, as an insulating film IF1, a silicon nitride film of about 100 nm thick is deposited on the barrier layer BA through PECVD (plasma-enhanced chemical vapor deposition) or the like.

Then, a photoresist film (not illustrated) for opening an element isolation region is formed and with this photoresist film as a mask, nitrogen ions are implanted to form the element isolation region (not illustrated). Implantation of ion species such as nitrogen (N) or boron (B) changes a crystal state and increases resistance. A region surrounded with the element isolation region becomes an active region AC (refer to FIG. 6).

Next, the insulating film IF1 is patterned by photolithography and etching to form an opening portion in a gate electrode formation region.

Figure 8:
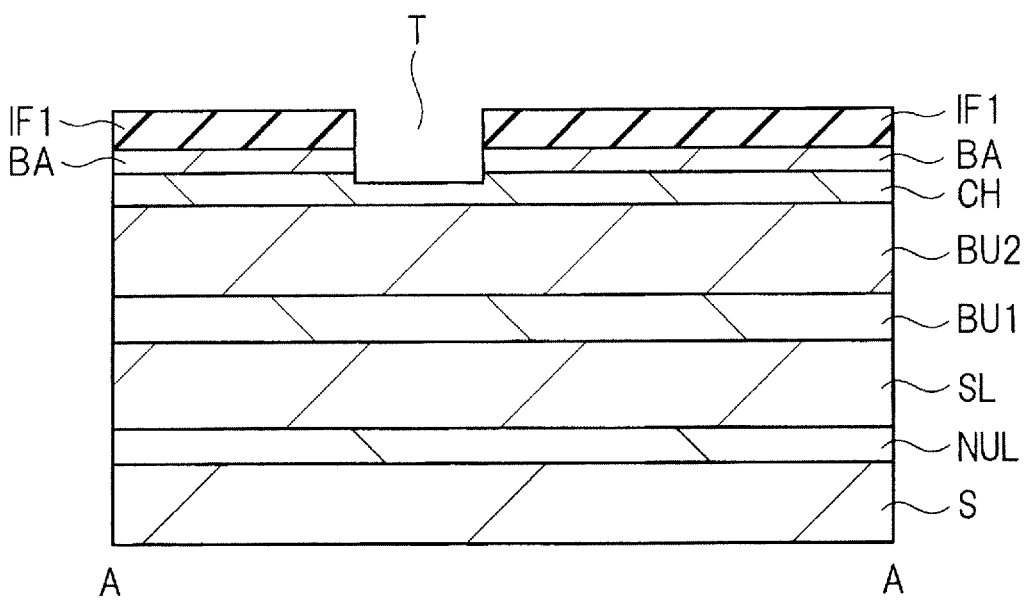
FIG. 8 is a cross-sectional view showing a manufacturing step of the semiconductor device of First Embodiment following that of FIG. 7.

Next, as shown in FIG. 8, with the insulating film IF1 as a mask, the barrier layer BA and the channel layer CH are dry etched to form a trench T penetrating through the barrier layer BA and reaching the middle of the channel layer CH. At this time, a trench for gate line GL may be formed in the element isolation region (refer to FIG. 6).

Figure 9:
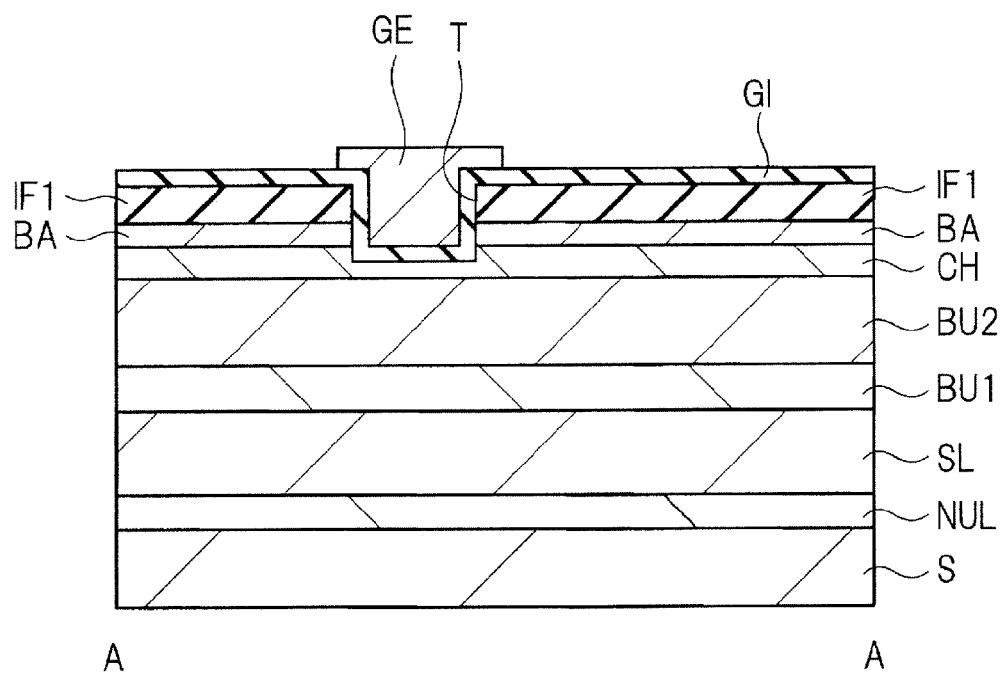
FIG. 9 is a cross-sectional view showing a manufacturing step of the semiconductor device of First Embodiment following that of FIG. 8.

Next, as shown in FIG. 9, a gate electrode GE is formed on the insulating film IF1 and also in the trench T via a gate insulating film GI. For example, as the gate insulating film GI, an aluminum oxide film of about 50 nm thick is deposited on the insulating film IF1 and also in the trench T through ALD (atomic layer deposition) or the like.

Instead of an aluminum oxide film, a silicon oxide film or a high dielectric constant film having a dielectric constant higher than that of the silicon oxide film may be used as the gate insulating film GI. As the high dielectric constant film, a hafnium-based insulating film such as $HfO_2$ film (hafnium oxide film), hafnium aluminate film, HfON film (hafnium oxynitride film), HfSiO film (hafnium silicate film), HfSiON film (hafnium silicon oxynitride film), or HfAlO film may be used.

Next, for example, a TiN (titanium nitride) film of about 200 nm thick is formed, as a conductive film, on the gate insulating film GI by sputtering or the like. Next, the TiN film is patterned by photolithography and etching to form a gate electrode GE and a gate line GL (refer to FIG. 6). At this time, the gate electrode GE may be patterned into a shape protruding on the side of a drain electrode DE which will be described later. This protruding portion is called "field plate electrode portion". Also at this time, the gate insulating film GI exposed from both sides of the gate electrode GE may be removed.

Figure 10:
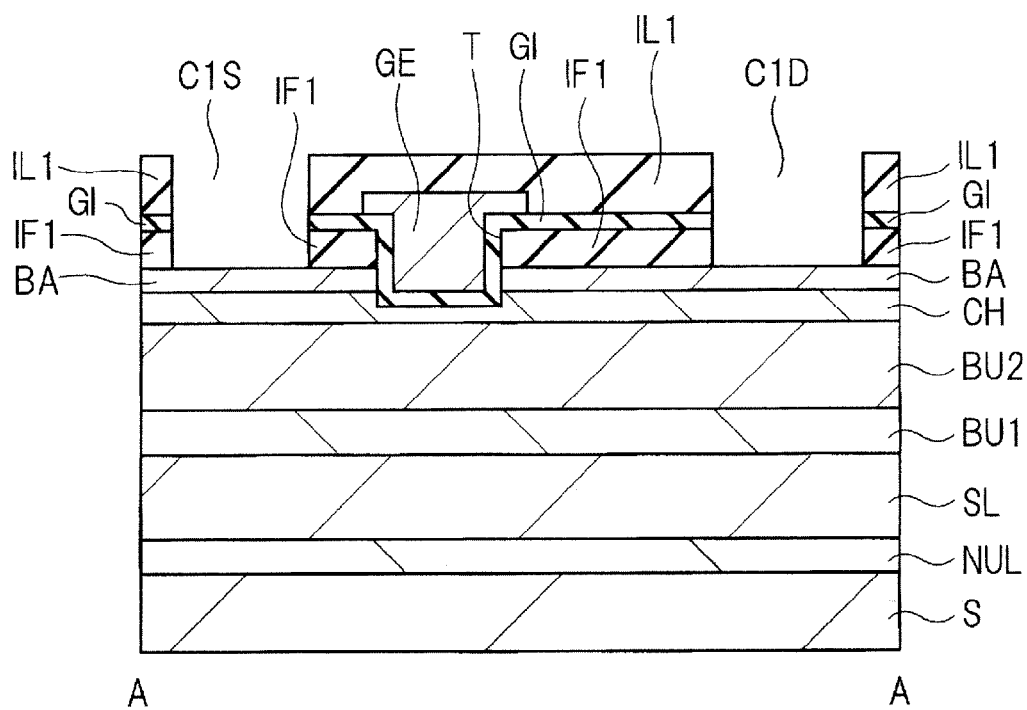
FIG. 10 is a cross-sectional view showing a manufacturing step of semiconductor device of First Embodiment following that of FIG. 9.

Next, as shown in FIG. 10, for example, a silicon oxide film of about 2000 nm thick is deposited as an interlayer insulating film IL1 on the gate insulating film GI and also on the gate electrode GE by PECVD or the like.

Next, contact holes C1S and C1D are formed in the interlayer insulating film IL1, the gate insulating film GI, and the insulating film IF1 by photolithography and etching. The contact holes C1S and C1D are formed in a source electrode coupling region and a drain electrode coupling region, respectively.

For example, a first photoresist film having an opening portion in each of the source electrode coupling region and the drain electrode coupling region is formed on the interlayer insulating film ILL Next, with the resulting first photoresist film as a mask, the interlayer insulating film IL1, the gate insulating film GI, and the insulating film IF1 are etched to form the contact holes C1S and C1D.

Figure 11:
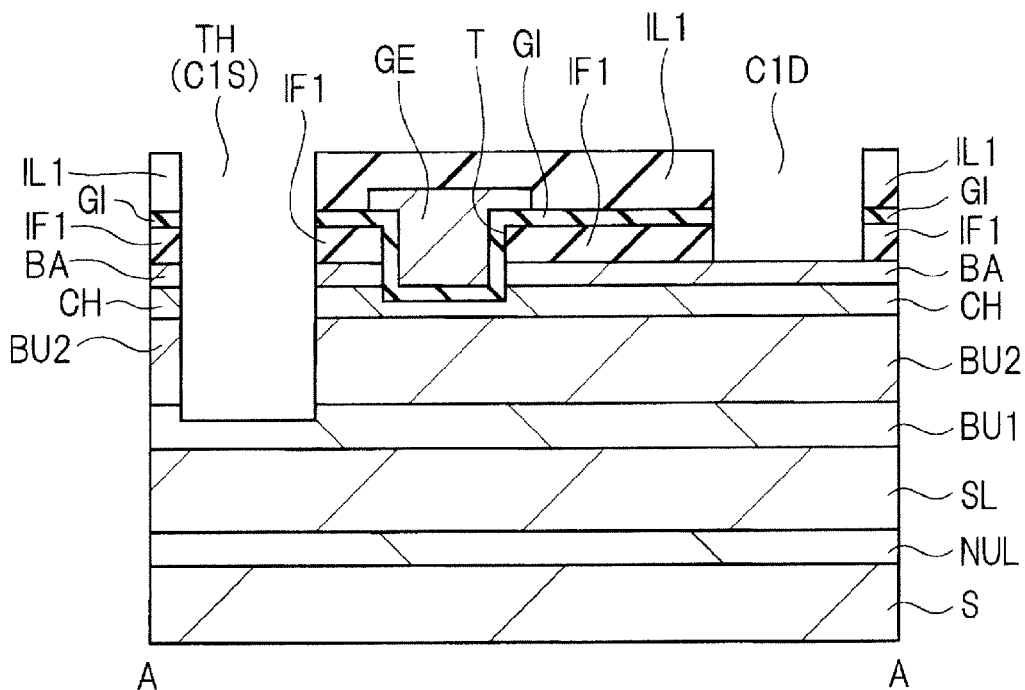
FIG. 11 is a cross-sectional view showing a manufacturing step of the semiconductor device of First Embodiment following that of FIG. 10.

Next, as shown in FIG. 11, the bottom surface of the contact hole C1S is etched further to form a through-hole TH. For example, after removal of the first photoresist film, a second photoresist film having an opening portion in a through-hole formation region (contact hole C1S portion) is formed on the interlayer insulating film ILL Then, with the resulting second photoresist film as a mask, the barrier layer BA, the channel layer CH, the buffer layer BU2, and a portion of the buffer layer BU1 are etched to form a through-hole TH. In other words, a through-hole TH penetrating through the interlayer insulating film IL1, the gate insulating film GI, the insulating film IF1, the barrier layer BA, the channel layer CH, and the buffer layer BU2 and reaching the middle of the buffer layer BU1 is formed. In such a manner, the above-mentioned etching is performed so that the through-hole TH has a bottom portion in the buffer layer BU1.

The formation order of the contact holes C1S and C1D and the through-hole TH is not limited to the above-mentioned one. Alternatively, after formation of the through-hole TH, the contact hole C1D may be formed.

The barrier layer BA is exposed from the bottom surface of the contact hole C1D formed in the above-mentioned step and the buffer layer BU1 is exposed from the bottom surface of the through-hole TH.

Figure 12:
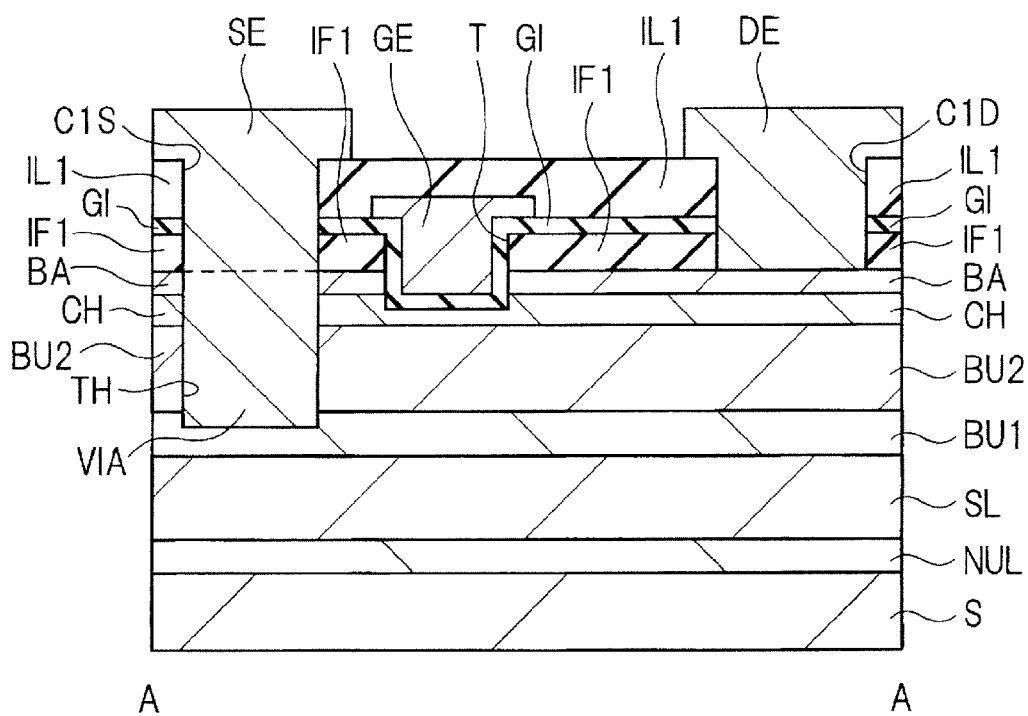
FIG. 12 is a cross-sectional view showing a manufacturing step of the semiconductor device of First Embodiment following that of FIG. 11.

Next, as shown in FIG. 12, a source electrode SE and a drain electrode DE are formed on both sides of the gate electrode GE, respectively and a coupling portion VIA is formed in the through-hole TH. In addition, a source pad SP to be electrically coupled to the source electrode SE is formed, while a drain pad DP to be electrically coupled to the drain electrode DE is formed (refer to FIG. 6).

For example, a conductive film is formed on the interlayer insulating film IL1 and also in the contact hole C1D and the through-hole TH. For example, as the conductive film, a stacked film (Al/TiN) made of a titanium nitride (TiN) film and an aluminum (Al) film lying thereon is formed by sputtering or the like. The titanium nitride film has a thickness of, for example, about 50 nm and the aluminum film has a thickness of, for example, about 1000 nm.

Next, a photoresist film (not illustrated) is formed in the formation regions of the source electrode SE, the drain electrode DE, the source pad SP, and the drain pad DP by photolithography. With the resulting photoresist film (not illustrated) as a mask, the conductive film (Al/TiN) is etched. By this step, a coupling portion VIA obtained by filling the through-hole TH with the conductive film is formed and also a source electrode SE, a drain electrode DE, a source pad SP, and a drain pad DP are formed. The source electrode SE and the drain electrode DE have, as shown in FIG. 6, a rectangular planar shape (line shape) having a long side in the direction Y. The source pad SP and the drain pad DP have, as shown in FIG. 6, a rectangular planar shape (line shape) having a long side in the direction X. The source pad SP is placed so as to couple a plurality of the source electrodes SE to each other, while the drain pad DP is placed so as to couple a plurality of the drain electrodes DE to each other.

The source electrode SE has thereunder the through-hole TH and the source electrode SE and the buffer layer BU1 are electrically coupled to each other via the coupling portion VIA.

Next, a protective film PRO is formed on the interlayer insulating film IL1 and also on the source electrode SE, the drain electrode DE, the source pad SP, and the drain pad DP. As the protective film PRO, for example, a silicon oxynitride (SiON) film is deposited by CVD or the like (FIG. 5).

Next, with the back surface side of the substrate S up, the back surface of the substrate S is polished to thin the substrate S. Next, for example, a stacked film (Al/TiN) made of a titanium nitride (TiN) film and an aluminum (Al) film lying thereon is deposited, as a conductive film, on the back surface of the substrate S through sputtering or the like to form a back-surface electrode BE (FIG. 5).

By the steps described above, the semiconductor device of the present embodiment can be manufactured. The above-mentioned steps are however shown as one example and the semiconductor device of the present embodiment may be manufactured by steps other than the above-mentioned ones.

According to the present embodiment, as described above, a stacked portion of the buffer layer BU1 and the buffer layer BU2 having an electron affinity smaller than that of the buffer layer BU1 is provided below the channel layer CH and the coupling portion VIA reaching a position lower than the interface between these buffer layers and to be coupled to the source electrode SE is provided. This enables the coupling portion VIA to bring the potential of the buffer layer BU1 close to a source potential (for example, ground potential) and also enables production of a two-dimensional electron gas 2DEG2 at the interface between the buffer layer BU1 and the buffer layer BU2. As a result, as described above, an increase in threshold voltage and improvement in normally-off characteristics can be achieved.

Figure 13:
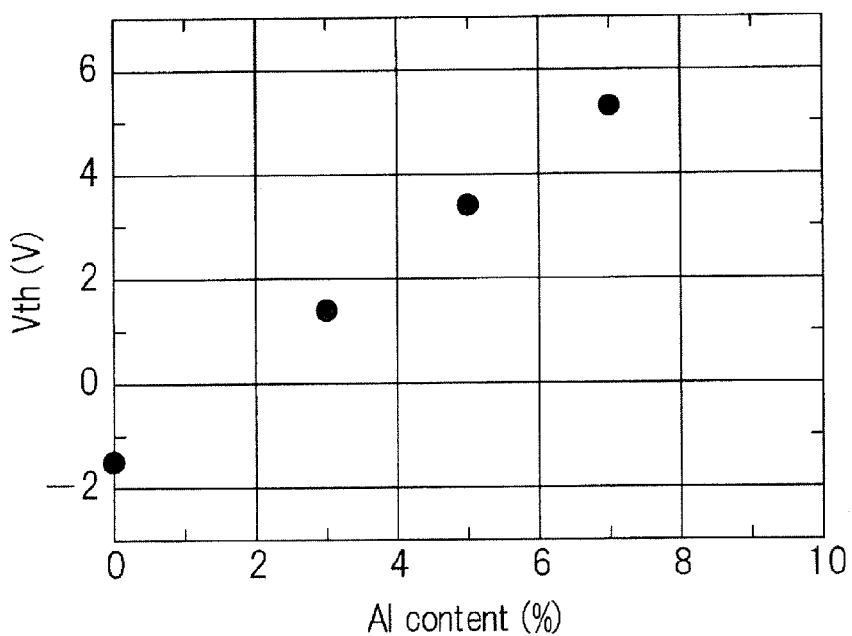
FIG. 13 is a graph showing the relationship, in the semiconductor device (MISFET) of First Embodiment, between an Al content of a buffer layer BU2 and a threshold voltage.

FIG. 13 is a graph showing the relationship, in the semiconductor device (MISFET) of the present embodiment, between an Al content of the buffer layer BU2 and a threshold voltage. A threshold voltage (Vth, [V]) is plotted along the ordinate and an Al content ([%]) is plotted along the abscissa. When the Al content is 0%, the threshold voltage is negative (normally-on) due to the influence of a positive fixed charge at the interface between the buffer layer (AlGaN) BU2 and the buffer layer (GaN) BU1. When the Al content increases, on the other hand, the threshold voltage increases. At an Al content of 5%, the threshold voltage exceeds "2 to 3V", that is, a threshold voltage preferable for adequate normally-off operation.

Figure 14:
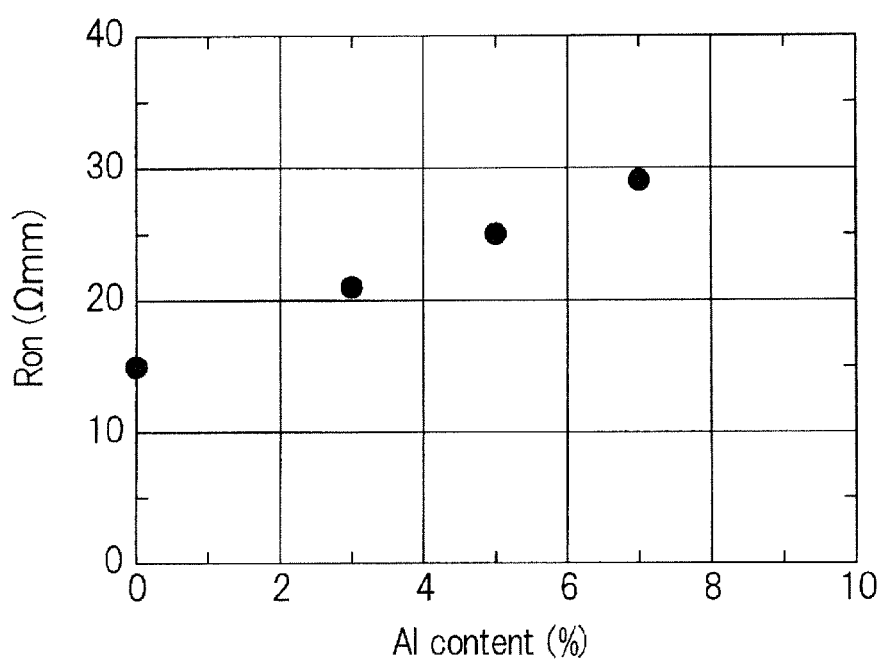
FIG. 14 is a graph showing the relationship, in the semiconductor device (MISFET) of First Embodiment, between an Al content of a buffer layer BU2 and an on resistance.

FIG. 14 is a graph showing the relationship, in the semiconductor device (MISFET) of the present embodiment, between an Al content of the buffer layer BU2 and the on resistance. An on resistance (Ron, [Ωmm]) is plotted along the ordinate and an Al content ([%]) is plotted along the abscissa. When the Al content is 0%, the on resistance is 15 Ωmm. When the Al content increases, on the other hand, the on resistance increases. This is presumed to occur because with an increase in the Al content, an in-plane tensile strain of the barrier layer BA decreases and positive polarization charge at the interface between the barrier layer BA and the channel layer CH decreases, leading to a decrease in carrier concentration of the two-dimensional electron gas 2DEG1.

Thus, there is a trade-off relationship between threshold voltage and on resistance when an Al content is changed. Therefore, the Al content is preferably 3% or more but not more than 8%, more preferably 4% or more but not more than 6%.

Second Embodiment

In First Embodiment, the source electrode SE has thereunder the coupling portion VIA, but the source pad SP may have thereunder the coupling portion VIA.

The semiconductor device of the present embodiment will next be described in detail while referring to drawings.
[Description on Structure]

Figure 15:
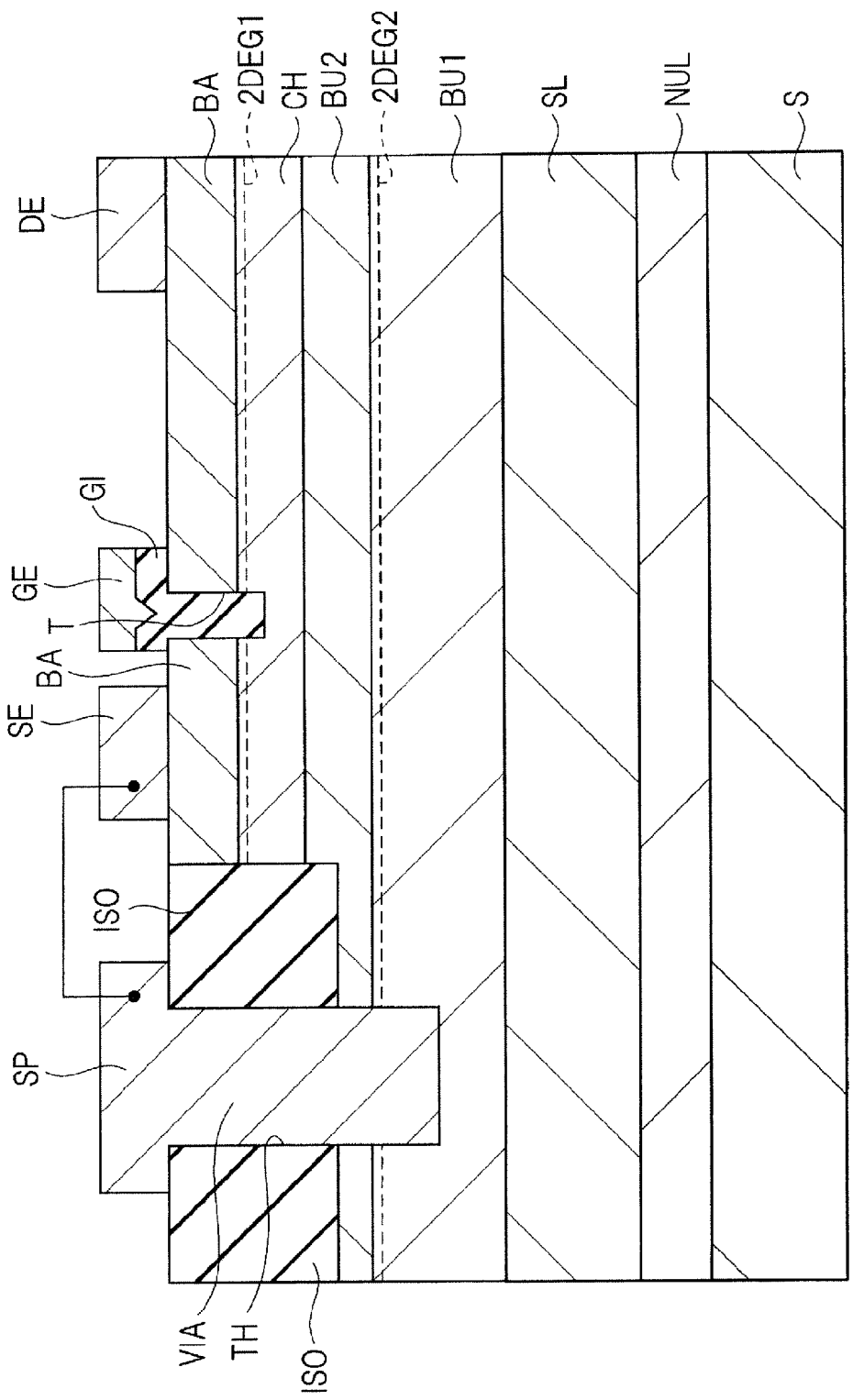
FIG. 15 is a cross-sectional view schematically showing the configuration of a semiconductor device of Second Embodiment.

FIG. 15 is a cross-sectional view schematically showing the configuration of the semiconductor device of the present embodiment. The semiconductor device (semiconductor element) of the present embodiment is an MIS type field effect transistor using a nitride semiconductor. This semiconductor device can be used as a high electron mobility transistor (HEMT) type power transistor. The semiconductor device of the present embodiment is a so-called recess gate type semiconductor device.

As in First Embodiment, the semiconductor device of the present embodiment has, on a substrate S thereof, a nucleus formation layer NUL, a superlattice layer SL, a buffer layer BU1, a buffer layer BU2, a channel layer, and a barrier layer BA in order of mention.

As in First Embodiment, the MISFET of the present embodiment has, over the channel layer CH thereof, a gate electrode GE formed via a gate insulating film GI and a source electrode SE and a drain electrode DE formed respectively on both sides of the gate electrode GE. The gate electrode GE lies, via a gate insulating film GI, in a trench T penetrating through the barrier layer BA and reaching the middle of the channel layer CH.

In the present embodiment, a source pad SP on an element isolation region ISO has thereunder a coupling portion VIA penetrating through the element isolation region ISO and the buffer layer BU2 and reaching the buffer layer BU1 lying thereunder. This coupling portion VIA is electrically coupled to the source electrode SE via the source pad SP.

Thus, also in the present embodiment, a stacked portion of the buffer layer BU1 and the buffer layer BU2 having an electron affinity smaller than that of the buffer layer BU1 is provided below the channel layer CH and the coupling portion VIA reaching a position below the interface therebetween and to be coupled to the source electrode SE is provided. This enables the coupling portion VIA to bring the potential of the buffer layer BU1 close to a source potential (for example, ground potential) and also enables production of a two-dimensional electron gas 2DEG at the interface between the buffer layer BU1 and the buffer layer BU2. As a result, as described specifically in First Embodiment, an increase in the threshold voltage and improvement in normally off characteristics can be achieved. In addition, since the coupling portion VIA is placed in the element isolation region ISO, miniaturization or high integration of semiconductor elements can be achieved.

Figure 16:
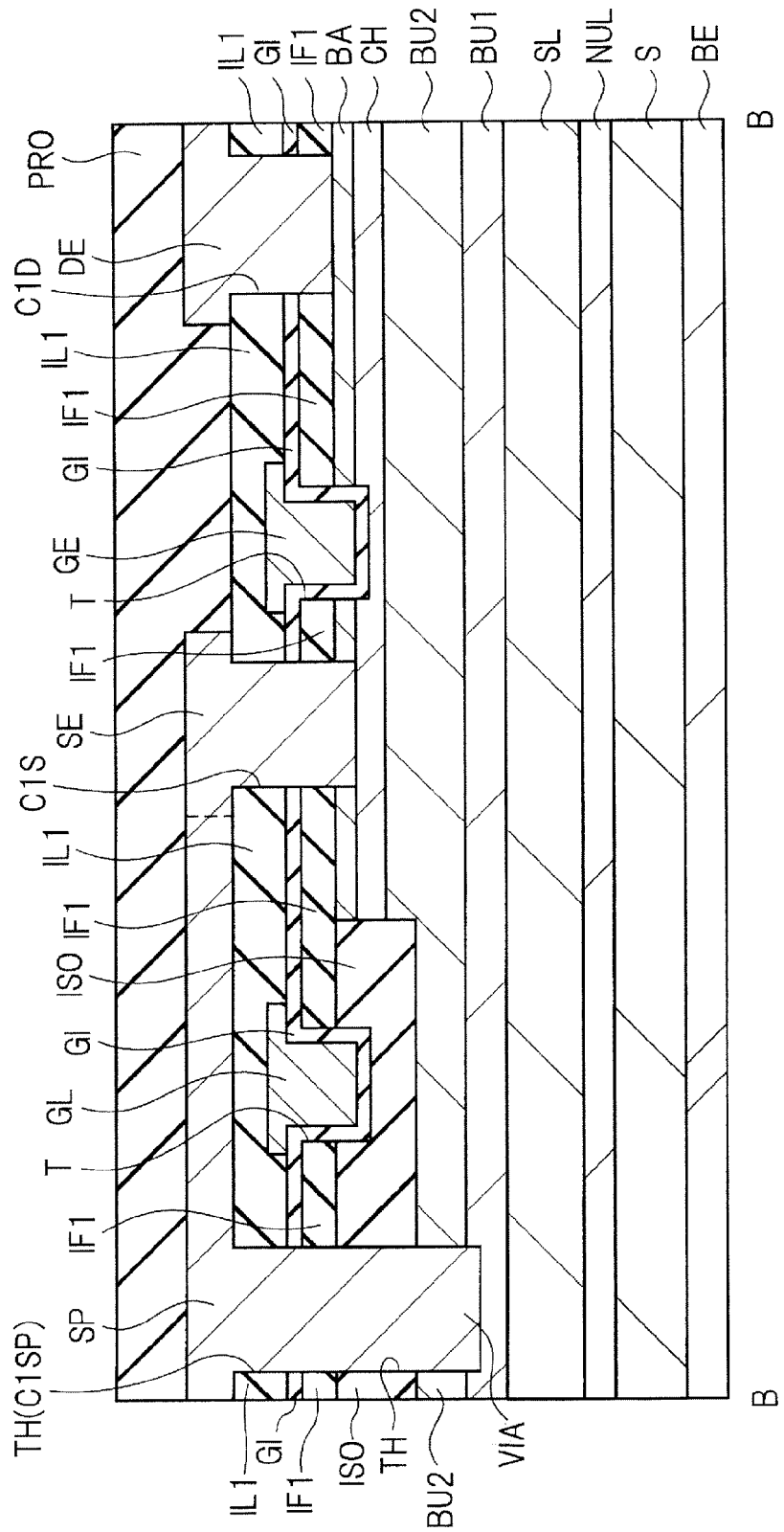
FIG. 16 is a cross-sectional view showing the configuration of the semiconductor device of Second Embodiment.
Figure 17:
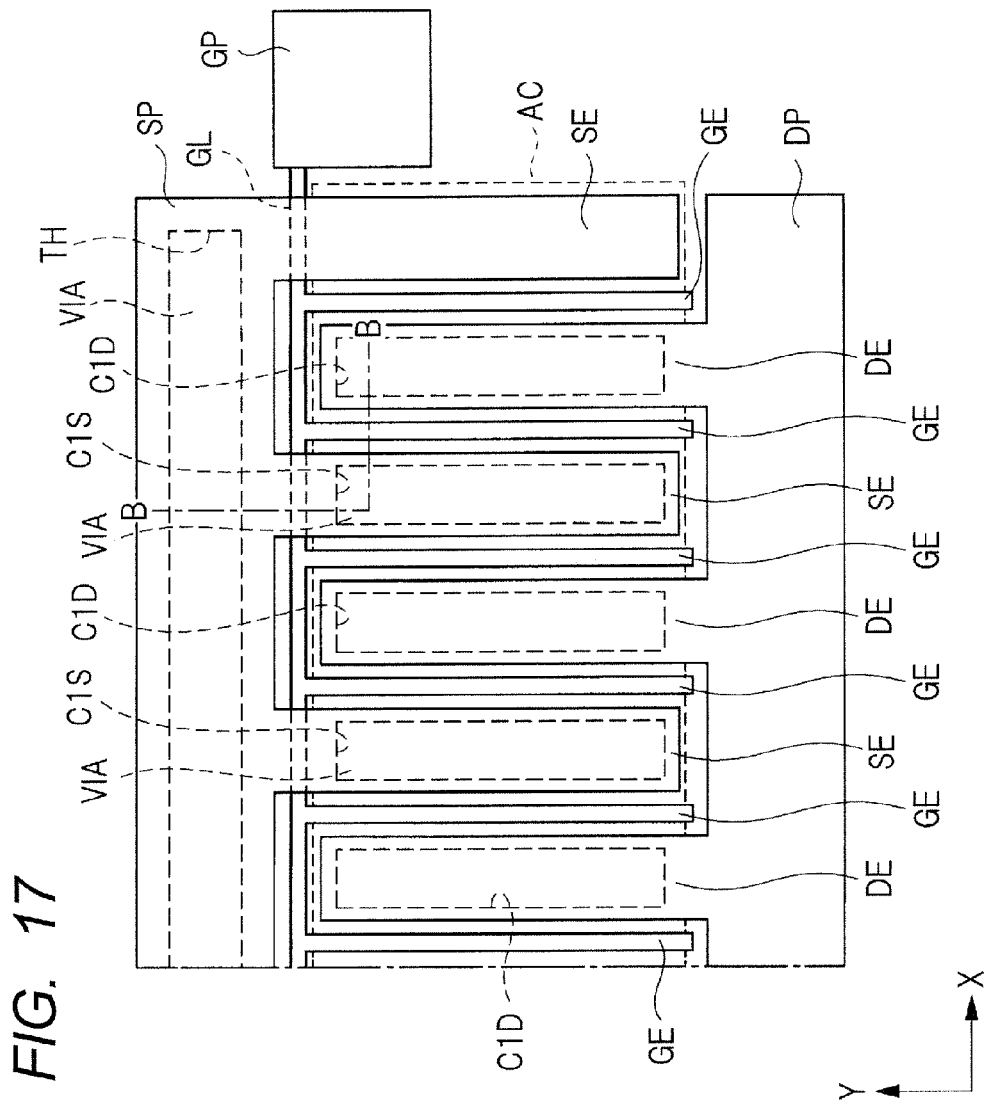
FIG. 17 is a plan view showing the configuration of the semiconductor device of Second Embodiment.

The semiconductor device of Second Embodiment will next be described in further detail while referring to FIGS. 16 and 17. FIG. 16 is a cross-sectional view showing the configuration of the semiconductor device of the present embodiment. FIG. 17 is a plan view showing the configuration of the semiconductor device of the present embodiment. FIG. 16 corresponds to the cross-section B-B of FIG. 17. Constitutions other than the formation position of the coupling portion VIA are similar to First Embodiment so that a detailed description on the configurations similar to those of First Embodiment will be omitted.

As shown in FIG. 16, the semiconductor device of the present embodiment has, on a substrate S thereof, a nucleus formation layer NUL, a superlattice layer SL, a buffer layer BU1, a buffer layer BU2, a channel layer CH, and a barrier layer BA, as in First Embodiment. The barrier layer BA has thereon an insulating film IF1.

The semiconductor device has, over the channel layer CH thereof, a gate electrode GE formed via a gate insulating film GI and a source electrode SE and a drain electrode DE placed on both sides of the gate electrode GE, respectively. The gate electrode GE lies, via the gate insulating film GI, in a trench T penetrating through the insulating film IF1 and the barrier layer BA and reaching the middle of the channel layer CH. The gate electrode GE has thereon an interlayer insulating film ILL An element isolation region ISO is an insulating region formed in the barrier layer BA, the channel layer CH, and the buffer layer BU2 and it is a region having resistance increased, for example, by nitrogen ion implantation into a portion of the barrier layer BA, the channel layer CH, and the buffer layer BU2.

The element isolation region ISO has, below the source pad thereon, a through-hole (also called "pore", "hole", or "recess") TH. This through-hole TH is filled with a conductive film and they configure the coupling portion VIA. As described above, the coupling portion VIA is coupled to the buffer layer BU1.

The source electrode SE and the drain electrode DE have thereon a protective film PRO.

The substrate S has, on the back-surface side thereof, a back-surface electrode BE.

As shown in FIG. 17, a plurality of linear drain electrodes DE is placed in the direction X with a predetermined distance and a plurality of linear source electrodes SE is placed in the direction X with a predetermined distance. As in First Embodiment, each of the source electrodes SE and each of the drain electrodes DE are placed alternately in the direction X.

As in First Embodiment, the drain electrode DE has therebelow a contact hole C1D which will be a coupling portion between the drain electrode DE and the barrier layer BA; and the source electrode SE has therebelow a contact hole C1D which will be a coupling portion between the source electrode SE and the barrier layer BA.

The drain electrodes DE are coupled to each other by a drain pad (also called "terminal portion") DP. This drain pad DP is placed so as to extend in the direction X on the side of one end of the drain electrode DE (on the lower side in FIG. 17).

The source electrodes SE are coupled to each other by a source pad (also called "terminal portion") SP. The source pad SP is placed so as to extend in the direction X on the side of the other end (on the upper side in FIG. 17) of the source electrodes SE.

The gate electrodes GE are coupled to each other by a gate line GL. This gate line GL is placed so as to extend in the direction X on the side of one end of the gate electrode GE (on the upper side in FIG. 17).

The source electrode SE, the drain electrode DE, and the gate electrode GE are placed mainly on an active region AC surrounded with the element isolation region (ISO). The active region AC has a rectangular planar shape having a long side in the direction X. On the other hand, the drain pad DP, gate line GL, and the source pad SP are placed on the element isolation region (ISO). The active region AC and the source pad SP have therebetween the gate line GL.

As described above, the source pad SP has therebelow a through-hole (also called "pore", "hole", or "recess") TH. This through-hole TH has therein a conductive film and they configure the coupling portion VIA. As described later, the coupling portion VIA is electrically coupled to the buffer layer BU1. The source pad SE and the buffer layer BU1 are therefore electrically coupled to each other via the source pad SP and the coupling portion VIA (FIG. 16).

Materials configuring the substrate S, the nucleus formation layer NUL, the superlattice layer SL, the buffer layer BU1, the buffer layer BU2, the channel layer CH, the barrier layer BA, and the insulating film IF1, respectively, are as described above in First Embodiment.

Materials configuring the gate insulating film GI, the gate electrode GE, the interlayer insulating film IL1, and the protective film PRO, respectively, are as described above in First Embodiment.

Materials configuring the source electrode SE, the drain electrode DE, the source pad SP, the drain pad D, and the coupling portion VIA, respectively, are as described above in First Embodiment.

[Description on Manufacturing Method]

Next, referring to FIGS. 18 to 21, a method of manufacturing the semiconductor device of the present embodiment will be described and at the same time, the configuration of the semiconductor device will be made clearer. FIGS. 18 to 21 are cross-sectional views showing manufacturing steps of the semiconductor device of the present embodiment.

Figure 18:
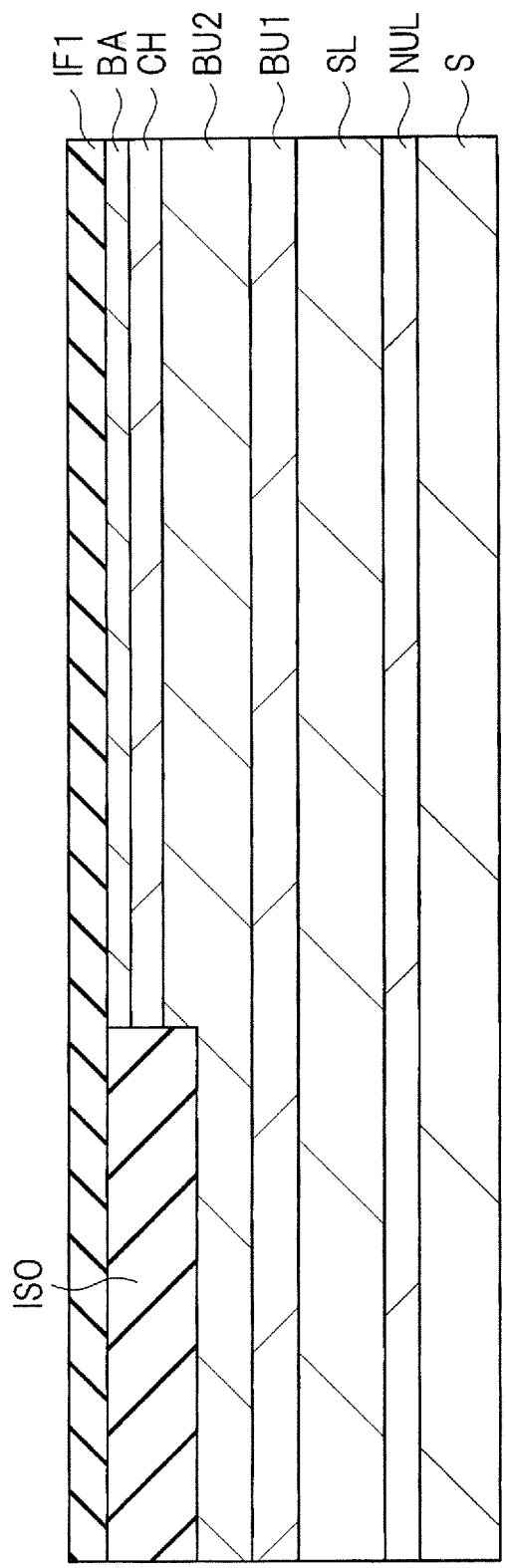
FIG. 18 is a cross-sectional view showing a manufacturing step of the semiconductor device of Second Embodiment.

As shown in FIG. 18, a nucleus formation layer NUL and a superlattice layer SL are formed successively on a substrate S. They can be formed in a manner similar to that of First Embodiment by using the materials described in First Embodiment.

Next, as a buffer layer BU1, a gallium nitride layer (i-GaN layer) is hetero-epitaxially grown on the superlattice layer SL through metal organic vapor phase deposition or the like. At this time, it is grown without intentional doping with an impurity. The buffer layer BU1 has a thickness of, for example, about 100 nm. As the buffer layer BU1, a gallium nitride layer (p-GaN layer) containing a p type impurity may be used.

Next, as a buffer layer BU2, an AlGaN layer is hetero-epitaxially grown on the buffer layer BU1 through metal organic vapor deposition or the like. It is grown without intentional impurity doping. The buffer layer BU2 has a thickness of, for example, about 1000 nm.

Next, a channel layer CH is formed on the buffer layer BU2. For example, a gallium nitride layer is hetero-epitaxially grown on the buffer layer BU2 through metal organic chemical vapor deposition or the like. At this time, it is grown without intentional impurity doping. The resulting channel layer CH has a film thickness of, for example, about 50 nm.

Next, as a barrier layer BA, for example, an AlGaN layer is hetero-epitaxially grown on the channel layer CH through metal organic vapor phase deposition or the like. For example, Al and Ga contents are set respectively at 0.2 and 0.8 to form an $Al_{0.2}Ga_{0.8}N$ layer. The Al content in the AlGaN layer formed as the barrier layer BA is made greater than the Al content in the AlGaN layer formed as the buffer layer BU2.

In such a manner, the stacked film of the buffer layer BU1, the buffer layer BU2, the channel layer CH, and the barrier layer BA is formed. In the stacked film, as described above, a two-dimensional electron gas (2DEG2) is produced in the vicinity of the interface between the buffer layer BU1 and the buffer layer BU2, while a two-dimensional electron gas (2DEG1) is produced in the vicinity of the interface between the channel layer CH and the barrier layer BA (refer to FIG. 1).

Next, as an insulating film IF1, a silicon nitride film of about 100 nm thick is deposited on the barrier layer BA by PECVD or the like.

Next, a photoresist film (not illustrated) for opening an element isolation region is formed by photolithography. With this photoresist film as a mask, nitrogen ions are implanted via the insulating film IF1 to form an element isolation region. Implantation of ion species such as nitrogen (N) or boron (B) changes a crystal state and increases resistance. Implantation conditions of nitrogen ions are regulated so as to position the implantation depth, that is, the bottom portion of the element isolation region ISO below the bottom surface of the channel layer CH and at the same time, above the bottom surface of the buffer layer BU1. The element isolation region ISO has a bottom portion above the bottom portion of a through-hole TH (coupling portion VIA) which will be described later. The element isolation region ISO is formed in such a manner. A region surrounded with the element isolation region ISO becomes an active region AC. As shown in FIG. 17, the active region AC has, for example, a substantially rectangular shape with a long side in the direction X. Then, the photoresist film is removed through release treatment with plasma.

Figure 19:
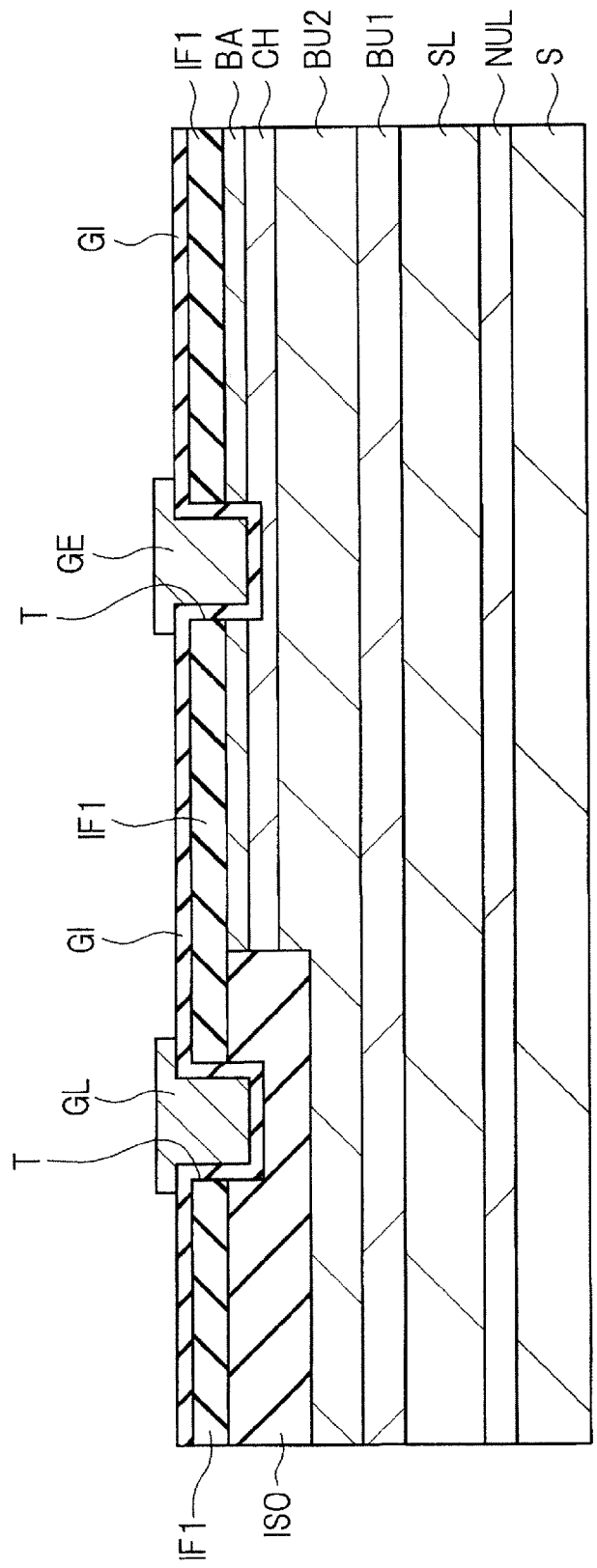
FIG. 19 is a cross-sectional view showing a manufacturing step of the semiconductor device of Second Embodiment following that of FIG. 18.

Next, as shown in FIG. 19, an opening portion is formed in a gate electrode formation region of the insulating film IF1 in a manner similar to that of First Embodiment. With the insulating film IF1 as a mask, the barrier layer BA and the channel layer CH are dry etched to form a trench T penetrating through the barrier layer BA and reaching the middle of the channel layer CH. At this time, a trench T for gate line GL may be formed in the element isolation region ISO.

Next, a gate electrode GE is formed on the insulating film IF1 and also in the trench T via the gate insulating film GI. The insulating film IF1 and the gate electrode GE can be formed in a manner similar to that of First Embodiment by using the material described in First Embodiment.

Figure 20:
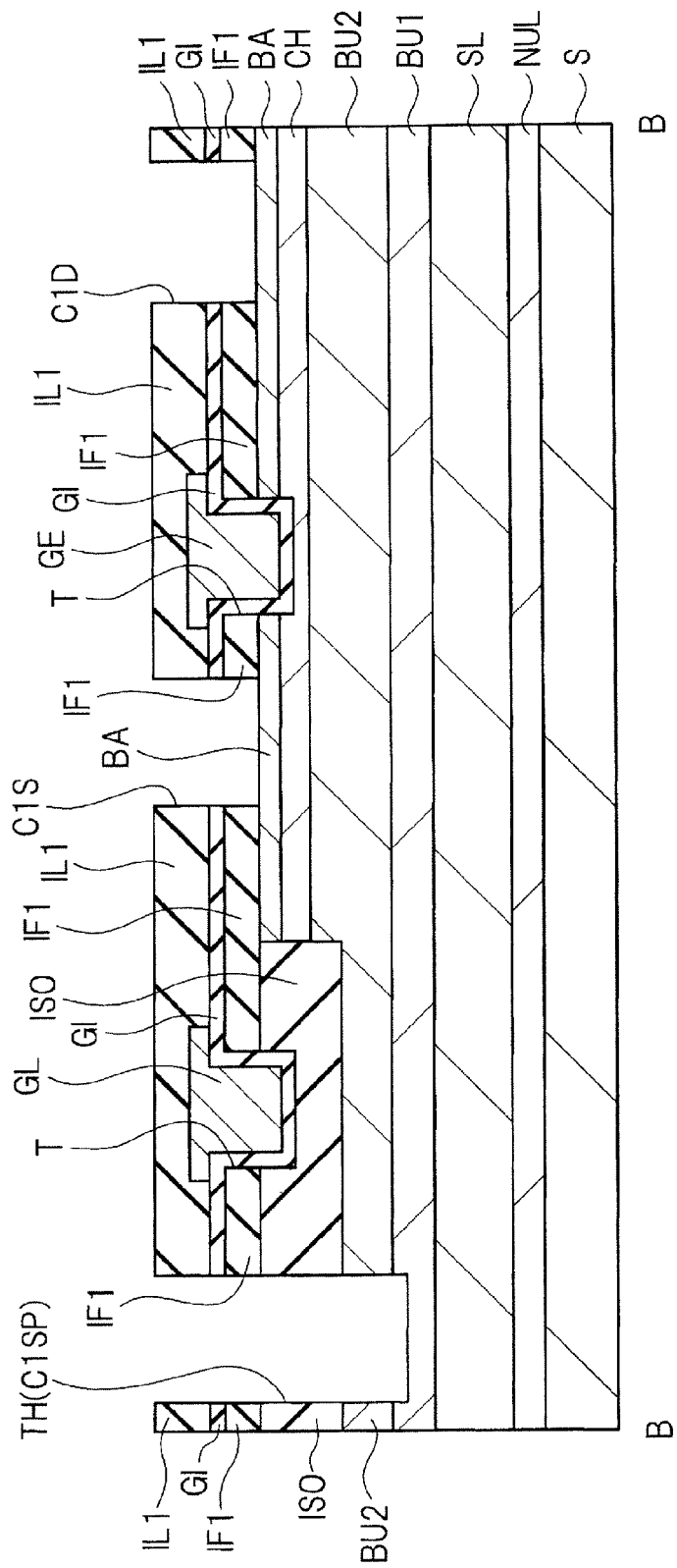
FIG. 20 is a cross-sectional view showing a manufacturing step of the semiconductor device of Second Embodiment following that of FIG. 19.

Next, as shown in FIG. 20, an interlayer insulating film IL1 is formed on the gate insulating film GI and also on the gate electrode GE in a manner similar to that of First Embodiment.

Next, contact holes C1S and C1D and a through-hole TH are formed in the interlayer insulating film IL1, the gate insulating film GI, and the insulating film IF1.

For example, a first photoresist film having an opening portion in each of a through-hole formation region, a source electrode coupling region, and a drain electrode coupling region is formed on the interlayer insulating film ILL Next, with the resulting first photoresist film as a mask, the interlayer insulating film IL1, the gate insulating film GI, and the insulating film IF1 are etched to form contact holes C1S, C1D, and C1SP. Next, after removal of the first photoresist film, a second photoresist film having an opening portion on the through-hole formation region (contact hole C1SP) is formed on the interlayer insulating film IL1 and also in the contact holes C1S and C1D. Then, with the resulting second photoresist film as a mask, the element isolation region ISO, the buffer layer BU2, and the buffer layer BU1 are etched partially to form a through-hole TH. In other words, a through-hole TH penetrating through the element isolation region ISO and the buffer layer BU2 and reaching the middle of the buffer layer BU1 is formed. It is to be noted that etching is performed so that the bottom portion of the through-hole TH lies in the buffer layer BU1 and at the same time, below the bottom portion of the element isolation region ISO.

The formation order of the contact holes C1S and C1D and the through-hole TH is not limited to the above-mentioned one. Alternatively, after formation of the through-hole TH, the contact holes C1S and C1D may be formed.

The barrier layer BA is exposed from the bottom surface of the contact holes C1S and C1D formed in the above-mentioned step and the buffer layer BU1 is exposed from the bottom surface of the through-hole TH.

Figure 21:
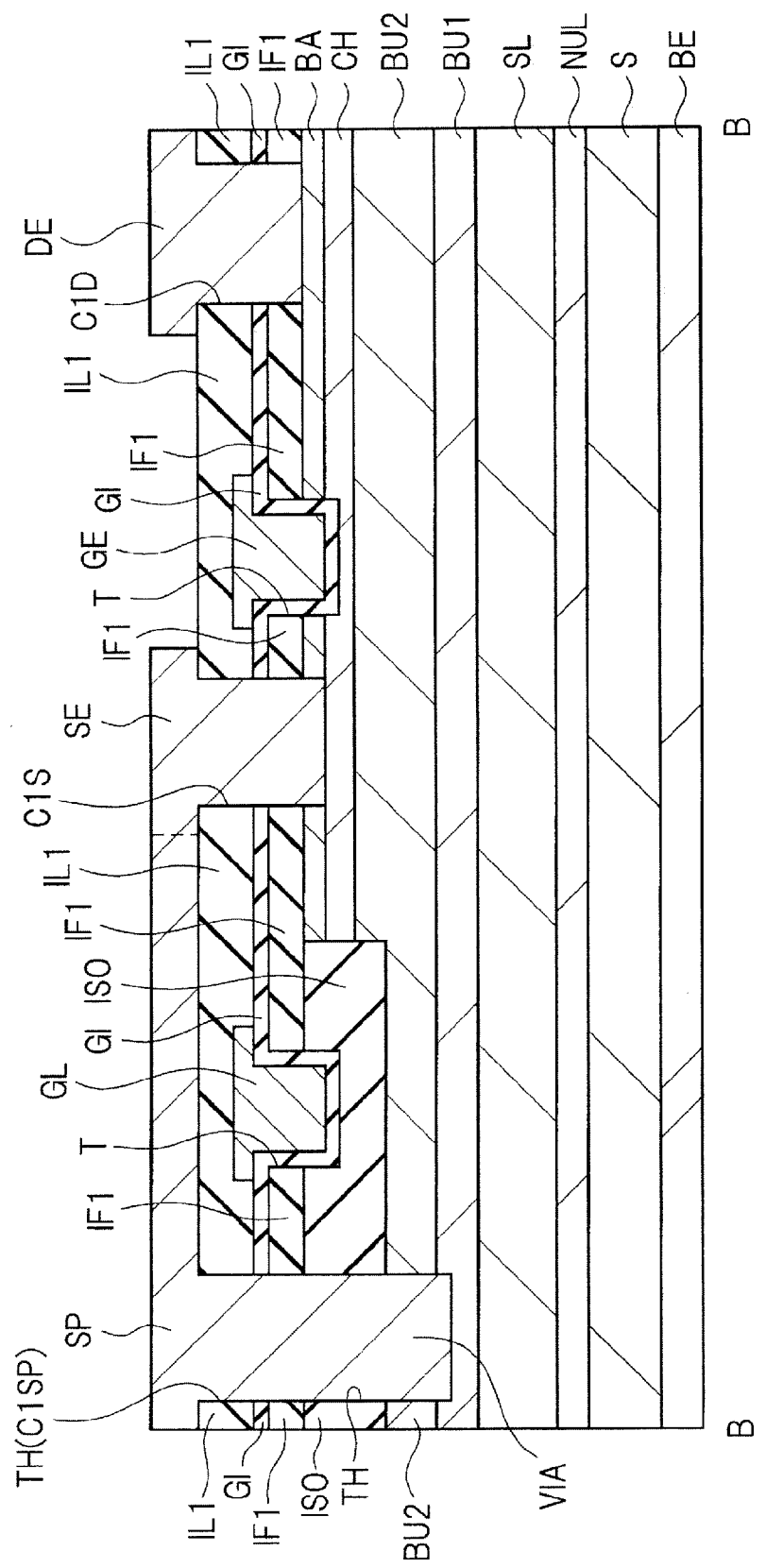
FIG. 21 is a cross-sectional view showing a manufacturing step of the semiconductor device of Second Embodiment following that of FIG. 20.

Next, as shown in FIG. 21, a source electrode SE, a drain electrode DE, a source pad SP, a drain pad PD, and a coupling portion VIA are formed by forming a conductive film on the interlayer insulating film IL1 and also in the contact holes C1S and C1D and the through-hole TH. They can be formed in a manner similar to that of First Embodiment by using the materials described in First Embodiment.

Next, in a manner similar to that of First Embodiment, a protective film PRO is formed on the interlayer insulating film IL1 and also on the source electrode SE, the drain electrode DE, the source pad SP, and the drain pad DP (FIG. 16).

Next with the back surface side of the substrate S up, the back surface of the substrate S is polished to thin the substrate S. Next, for example, a stacked film (Al/TiN) made of a titanium nitride (TiN) film and an aluminum (Al) film lying thereon is deposited, as a conductive film, on the back surface of the substrate S by sputtering or the like to form a back-surface electrode BE (FIG. 16).

By the steps described above, the semiconductor device of the present embodiment can be manufactured. The above-mentioned steps are however shown as one example and the semiconductor device of the present embodiment may be manufactured by steps other than the above-mentioned steps.

Third Embodiment

In First and Second Embodiments, the coupling portion VIA is provided on the surface side of the substrate S, but the coupling portion VIA may be provided on the back surface side of the substrate S.

The semiconductor device of the present embodiment will next be described in detail while referring to drawings.
[Description on Structure]

Figure 22:
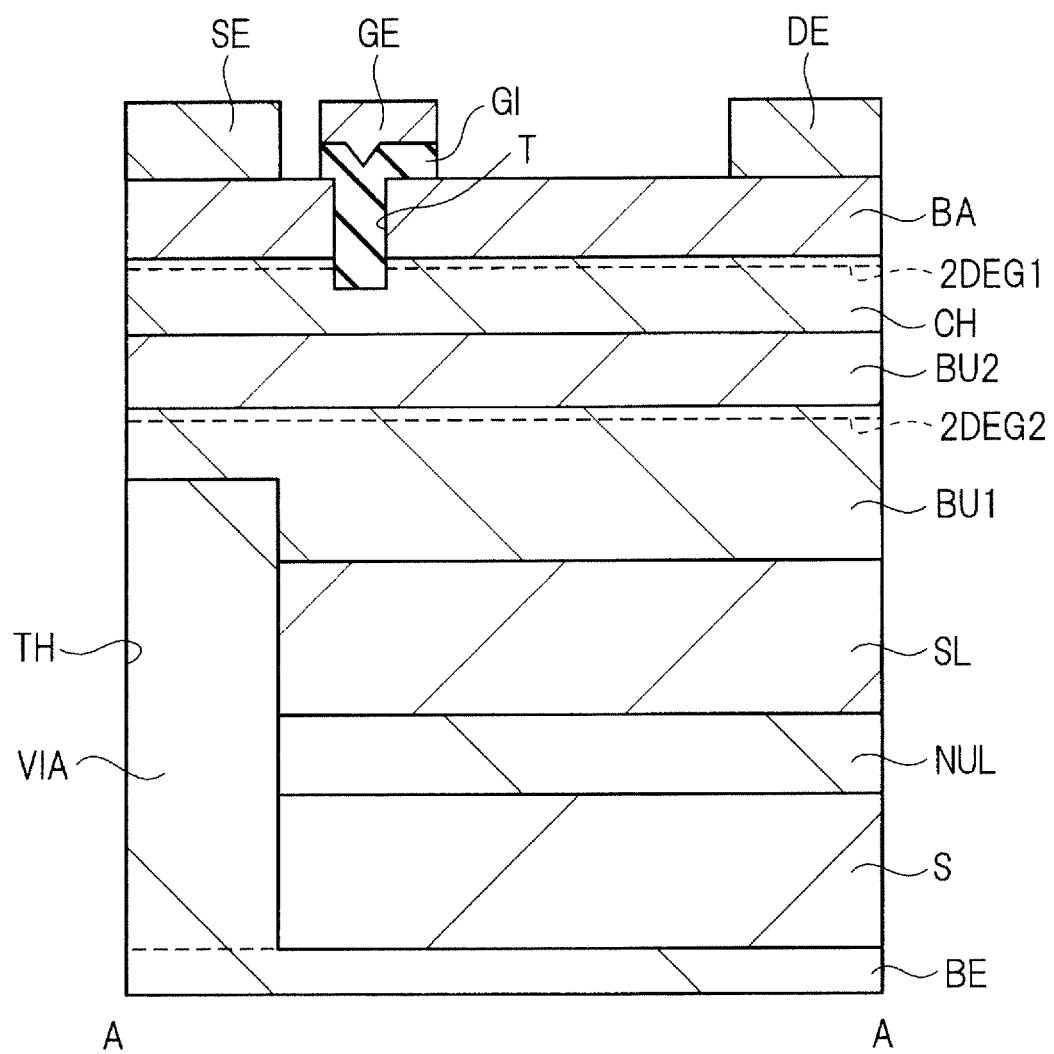
FIG. 22 is a cross-sectional view schematically showing the configuration of a semiconductor device of Third Embodiment.

FIG. 22 is a cross-sectional view schematically showing the configuration of the semiconductor device of the present embodiment. The semiconductor device (semiconductor element) of the present embodiment is an MIS type field effect transistor using a nitride semiconductor. This semiconductor device can be used as a high electron mobility transistor (HEMT) type power transistor. The semiconductor device of the present embodiment is a so-called recess gate type semiconductor device.

As in First Embodiment, the semiconductor device of the present embodiment has, on a substrate S thereof, a nucleus formation layer NUL, a superlattice layer SL, a buffer layer BU1, a buffer layer BU2, a channel layer, and a barrier layer BA in order of mention.

As in First Embodiment, the MISFET of the present embodiment has, over the channel layer CH thereof, a gate electrode GE formed via a gate insulating film GI and a source electrode SE and a drain electrode DE formed respectively on both sides of the gate electrode GE. The gate electrode GE lies, via the gate insulating film GI, in a trench T penetrating through the barrier layer BA and reaching the middle of the channel layer CH.

The semiconductor device of the present embodiment is provided with a coupling portion VIA starting from the back surface of the substrate S, penetrating through the substrate S, the nucleus formation layer NUL, and the superlattice layer SL, and reaching the buffer layer BU1. This coupling portion VIA is electrically coupled to a source potential (for example, ground potential) via the back surface electrode BE.

Thus, also in the present embodiment, a stacked portion of the buffer layer BU1 and the buffer layer BU2 having an electron affinity smaller than that of the buffer layer BU1 is provided below the channel layer CH and the coupling portion VIA starting from the back surface of the substrate S and reaching the buffer layer BU1 is provided. This enables the coupling portion VIA to bring the potential of the buffer layer BU1 close to a source potential (for example, ground potential) and also enables production of a two-dimensional electron gas 2DEG at the interface between the buffer layer BU1 and the buffer layer BU2. As a result, as described specifically in First Embodiment, an increase in the threshold voltage and improvement in normally off characteristics can be achieved. In addition, since the coupling portion VIA is placed in the back surface side of the substrate S, miniaturization or high integration of semiconductor elements can be achieved.

Figure 23:
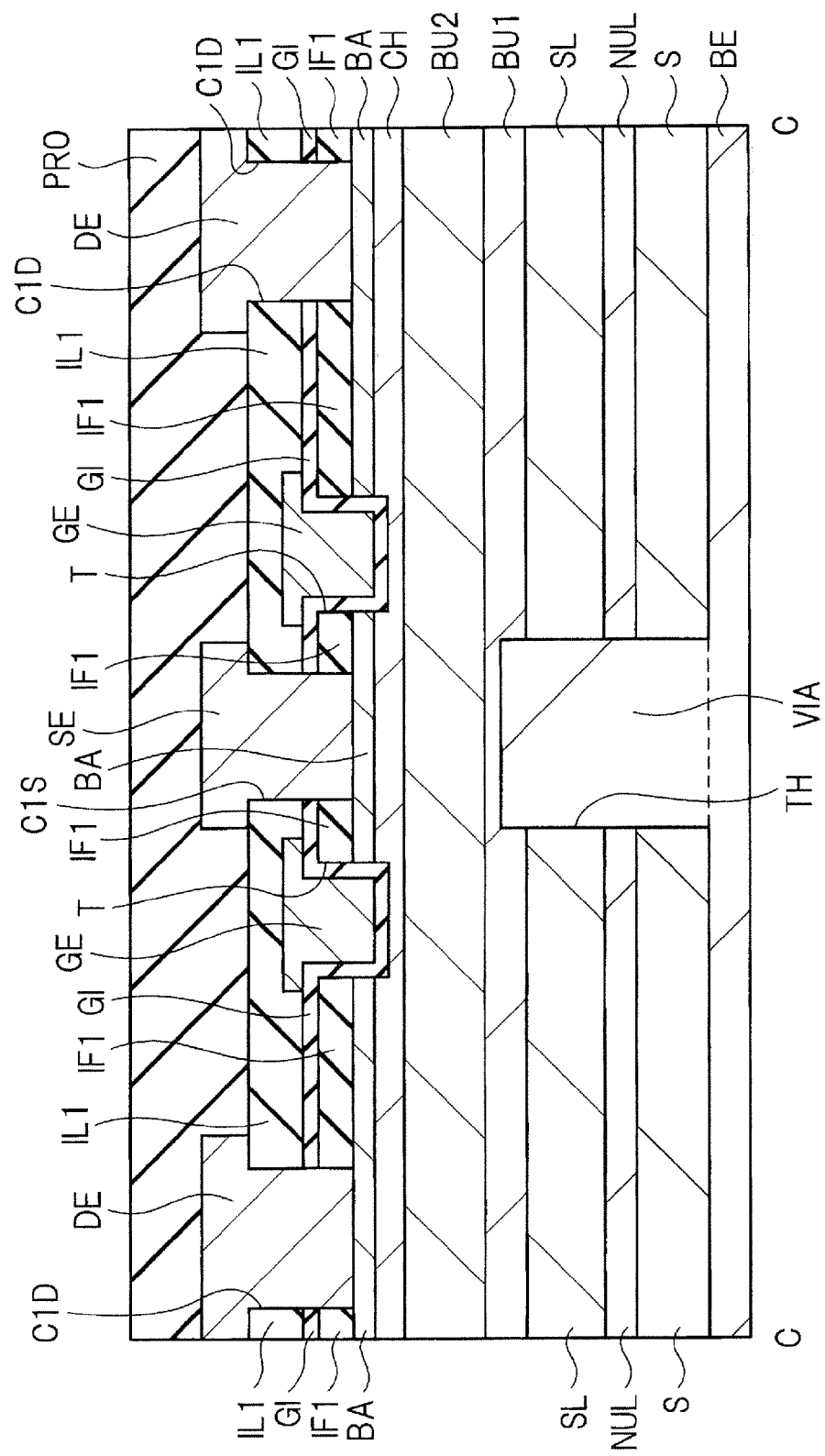
FIG. 23 is a cross-sectional view showing the configuration of the semiconductor device of Third Embodiment.
Figure 24:
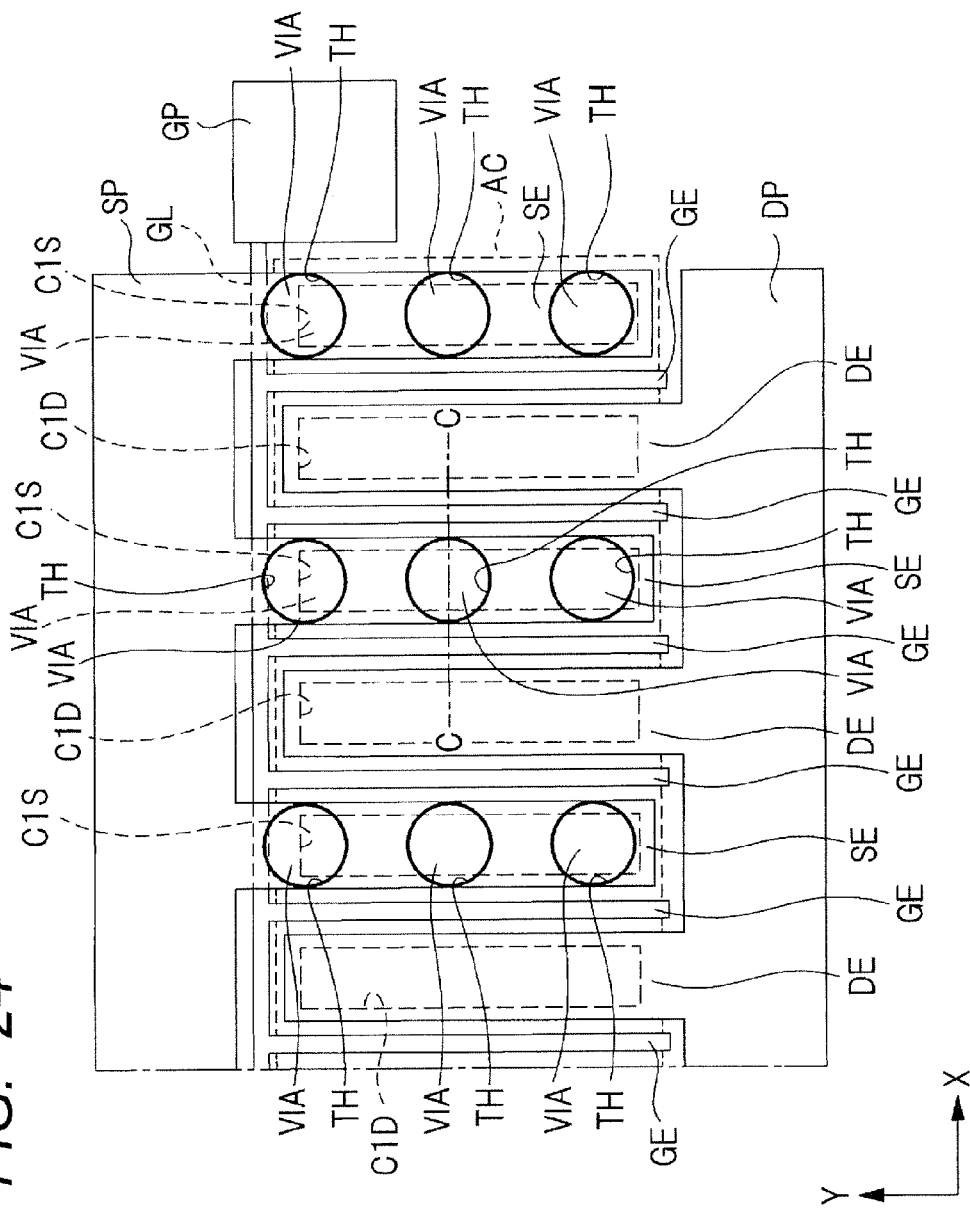
FIG. 24 is a plan view showing the configuration of the semiconductor device of Third Embodiment.

The semiconductor device of Third Embodiment will next be described in further detail while referring to FIGS. 23 and 24. FIG. 23 is a cross-sectional view showing the configuration of the semiconductor device of the present embodiment. FIG. 24 is a plan view showing the configuration of the semiconductor device of the present embodiment. FIG. 23 corresponds to the cross-section C-C of FIG. 24. Constitutions other than the formation position of the coupling portion VIA (meaning the configurations on the surface side of the substrate S) are similar to Second Embodiment so that a detailed description on the configurations similar to those of Second Embodiment will be omitted.

As shown in FIG. 23, the semiconductor device of the present embodiment has, on a substrate S thereof, a nucleus formation layer NUL, a superlattice layer SL, a buffer layer BU1, a buffer layer BU2, a channel layer CH, and a barrier layer BA in order of mention, as in First Embodiment. The barrier layer BA has thereon an insulating film IF1.

The semiconductor device has, over the channel layer CH thereof, a gate electrode GE formed via a gate insulating film GI and a source electrode SE and a drain electrode DE placed on both sides of the gate electrode GE, respectively. The gate electrode GE lies, via the gate insulating film GI, in a trench T penetrating through the insulating film IF1 and the barrier layer BA and reaching the middle of the channel layer CH. The gate electrode GE has thereon an interlayer insulating film IL1.

The source electrode SE and the drain electrode DE have thereon a protective film PRO.

In the present embodiment, a coupling portion VIA starting from the back surface of the substrate S, penetrating through the substrate S, the nucleus formation layer NUL, and the superlattice layer SL, and reaching the buffer layer BU1 is provided. The substrate S has, on the back surface thereof, a back-surface electrode BE. The coupling portion VIA is coupled to the buffer layer BU1 and is electrically coupled to a source potential (for example, ground potential) via the back-surface electrode BE.

As shown in FIG. 24, a plurality of linear drain electrodes DE is placed in the direction X with a predetermined distance, while a plurality of linear source electrodes SE is placed in the direction X with a predetermined distance. As in First Embodiment, each of the source electrodes SE and each of the drain electrodes DE is placed alternately along the direction X.

As in First Embodiment, the drain electrode DE has therebelow a contact hole C1D which will be a coupling portion between the drain electrode DE and the barrier layer BA. The source electrode SE has therebelow a contact hole C1S which will be a coupling portion between the source electrode SE and the barrier layer BA.

The drain electrodes DE are coupled to each other by a drain pad (also called "terminal portion") DP, while the source electrodes SE are coupled to each other by a source pad (also called "terminal portion") SP. The gate electrodes GE are coupled to each other by a gate line GL. This gate line GL is placed so as to extend in the direction X on the side of one end of the gate electrode GE (on the upper side in FIG. 24).

As shown with a circle portion in FIG. 24, a through-hole (also called "pore", "hole", or "recess") TH is placed. The through-hole TH is however provided on the back surface side of the substrate S as shown in FIG. 23. This means that the through-hole TH penetrating through the substrate S, the nucleus formation layer NUL, and the superlattice layer SL and reaching the buffer layer BU1 has therein a coupling portion VIA. This coupling portion VIA is electrically coupled to a source potential (for example, ground potential) via the back-surface electrode BE. In FIG. 24, the through-hole TH (circle portion) is placed at a position corresponding to the source electrode SE but the position of the through-hole TH (circle portion) is not limited to it. The through-hole TH (circle portion) is provided on the back surface side of the substrate S so that it can be laid out freely without being limited by a pattern layout on the surface side.

Materials configuring the substrate S, the nucleus formation layer NUL, the superlattice layer SL, the buffer layer BU1, the buffer layer BU2, the channel layer CH, the barrier layer BA, and the insulating film IF1, respectively, are as described above in First Embodiment.

Materials configuring the gate insulating film GI, the gate electrode GE, the interlayer insulating film IL1, and the protective film PRO, respectively, are as described above in First Embodiment.

Materials configuring the source electrode SE, the drain electrode DE, the source pad SP, the drain pad DP, and the coupling portion VIA (back-surface electrode BE), respectively, are as described above in First Embodiment. In the present embodiment, the source electrode SE, the drain electrode DE, the source pad SP, and the drain pad DP may be made of a material different from a material configuring the coupling portion VIA (back-surface electrode BE).

[Description on Manufacturing Method]

Next, referring to FIGS. 25 to 28, a method of manufacturing the semiconductor device of the present embodiment will be described and at the same time, the configuration of the semiconductor device will be made clearer. FIGS. 25 to 28 are cross-sectional views showing manufacturing steps of the semiconductor device of the present embodiment.

Figure 25:
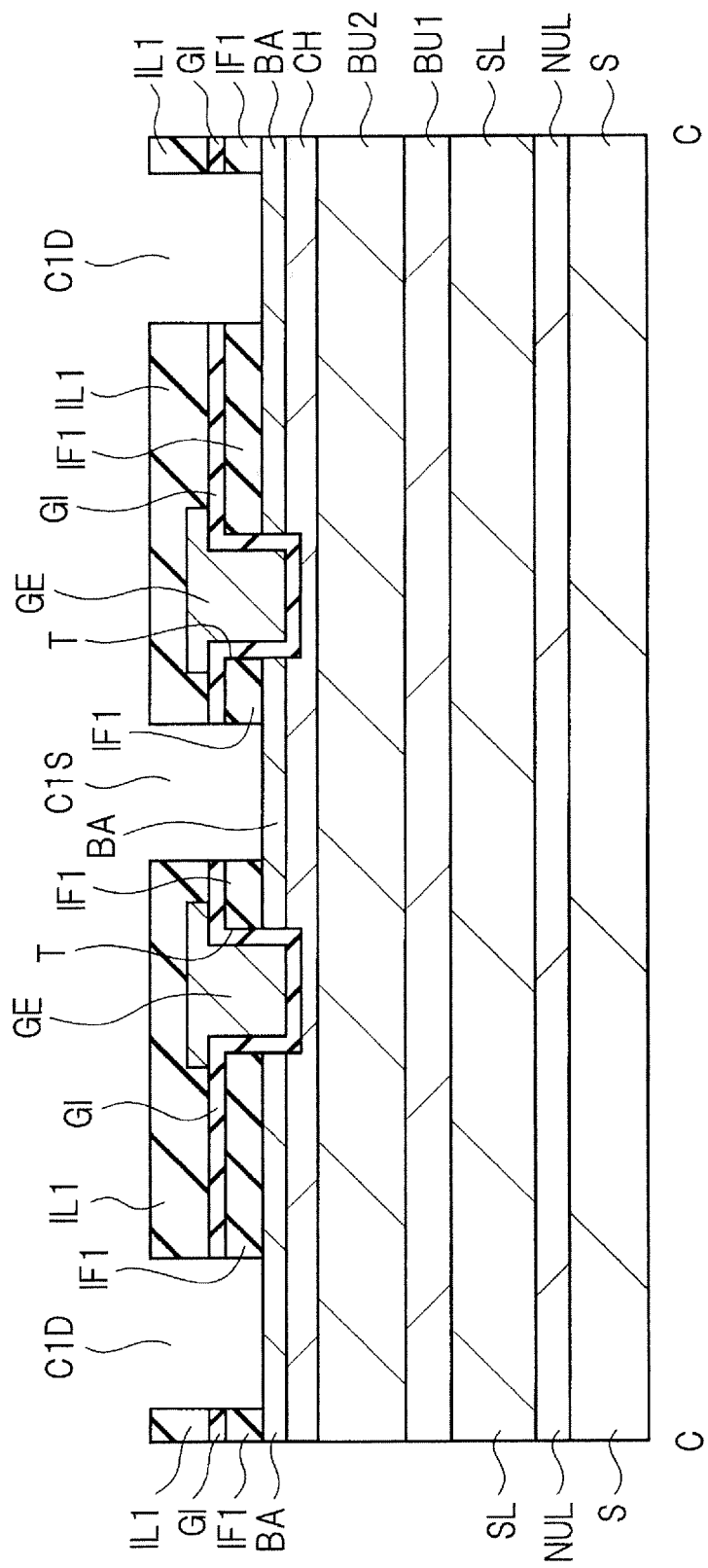
FIG. 25 is a cross-sectional view showing a manufacturing step of the semiconductor device of Third Embodiment.

As shown in FIG. 25, a nucleus formation layer NUL, a superlattice layer SL, a buffer layer BU1, a buffer layer BU2, a channel layer CH, and a barrier layer BA are formed successively on a substrate S. They can be formed in a manner similar to that of First Embodiment or Second Embodiment by using the materials as described in First Embodiment or Second Embodiment. Next, as in First Embodiment or Second Embodiment, an insulating film IF1 is formed on the barrier layer BA.

Next, as in First Embodiment, a photoresist film (not illustrated) for opening an element isolation region is formed and with this photoresist film as a mask, nitrogen ions are implanted to form the element isolation region (not illustrated).

Next, in a manner similar to that of First Embodiment, a trench T penetrating through the barrier layer BA and reaching the middle of the channel layer CH is formed. A gate electrode GE is formed in this trench T via the gate insulating film GI. Next, as in First Embodiment, an interlayer insulating film IL1 is formed on the gate electrode GE and then, contact holes C1S and C1D are formed in the interlayer insulating film IL1, the gate insulating film GI, and the insulating film IF1.

For example, a photoresist film (not illustrated) having opening portions in a source electrode coupling region and a drain electrode coupling region, respectively, is formed on the interlayer insulating film IL1. Then, with this photoresist film as a mask, the interlayer insulating film IL1, the gate insulating film GI, and the insulating film IF1 are etched to form contact holes C1S and C1D. The barrier layer BA is exposed from the bottom surface of these contact holes C1S and C1D.

Figure 26:
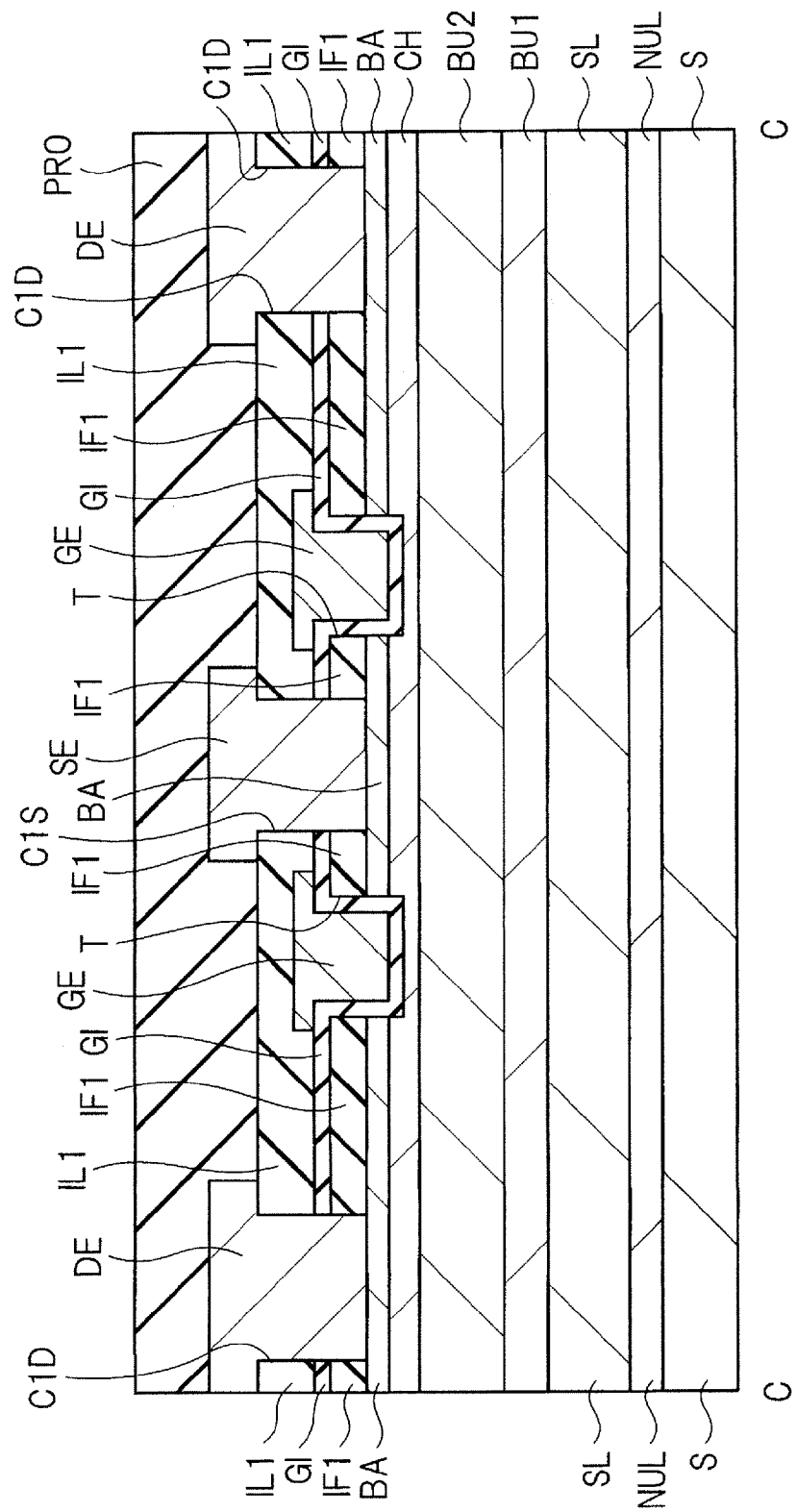
FIG. 26 is a cross-sectional view showing a manufacturing step of the semiconductor device of Third Embodiment following that of FIG. 25.

Next, as shown in FIG. 26, a source electrode SE, a drain electrode DE, a source pad SP, and a drain pad DP are formed by forming a conductive film on the interlayer insulating film IL1 and also in the contact holes C1S and C1D. They can be formed as in First Embodiment by using a material described above in First Embodiment.

Next, as in First Embodiment, a protective film PRO is formed on the interlayer insulating film IL1 and also on the source electrode SE, the drain electrode DE, the source pad SP, and the drain pad DP.

Figure 27:
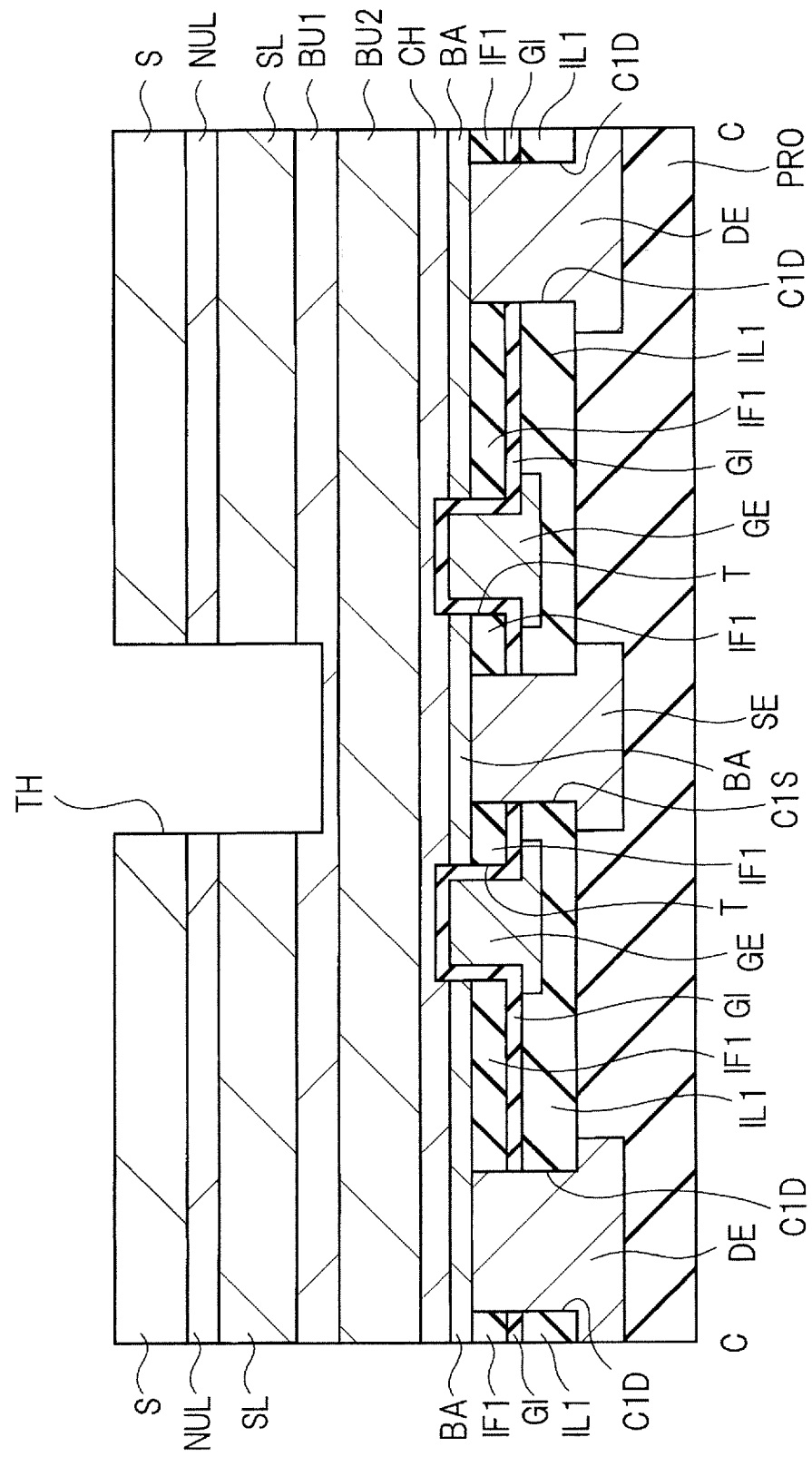
FIG. 27 is a cross-sectional view showing a manufacturing step of the semiconductor device of Third Embodiment following that of FIG. 26.

Next, with the back surface side of the substrate S up, the back surface of the substrate S is polished to thin the substrate S. Next, as shown in FIG. 27, a mask film (not illustrated) having an opening portion in a through-hole formation region is formed on the back surface of the substrate S and with this mask film as a mask, the substrate S, the nucleus formation layer NUL, the superlattice layer SL, and the buffer layer BU1 are partially etched to form a through-hole TH. In other words, a through-hole TH penetrating through the substrate S, the nucleus formation layer NUL, and the superlattice layer SL and reaching the buffer layer BU1 lying thereunder is formed.

Figure 28:
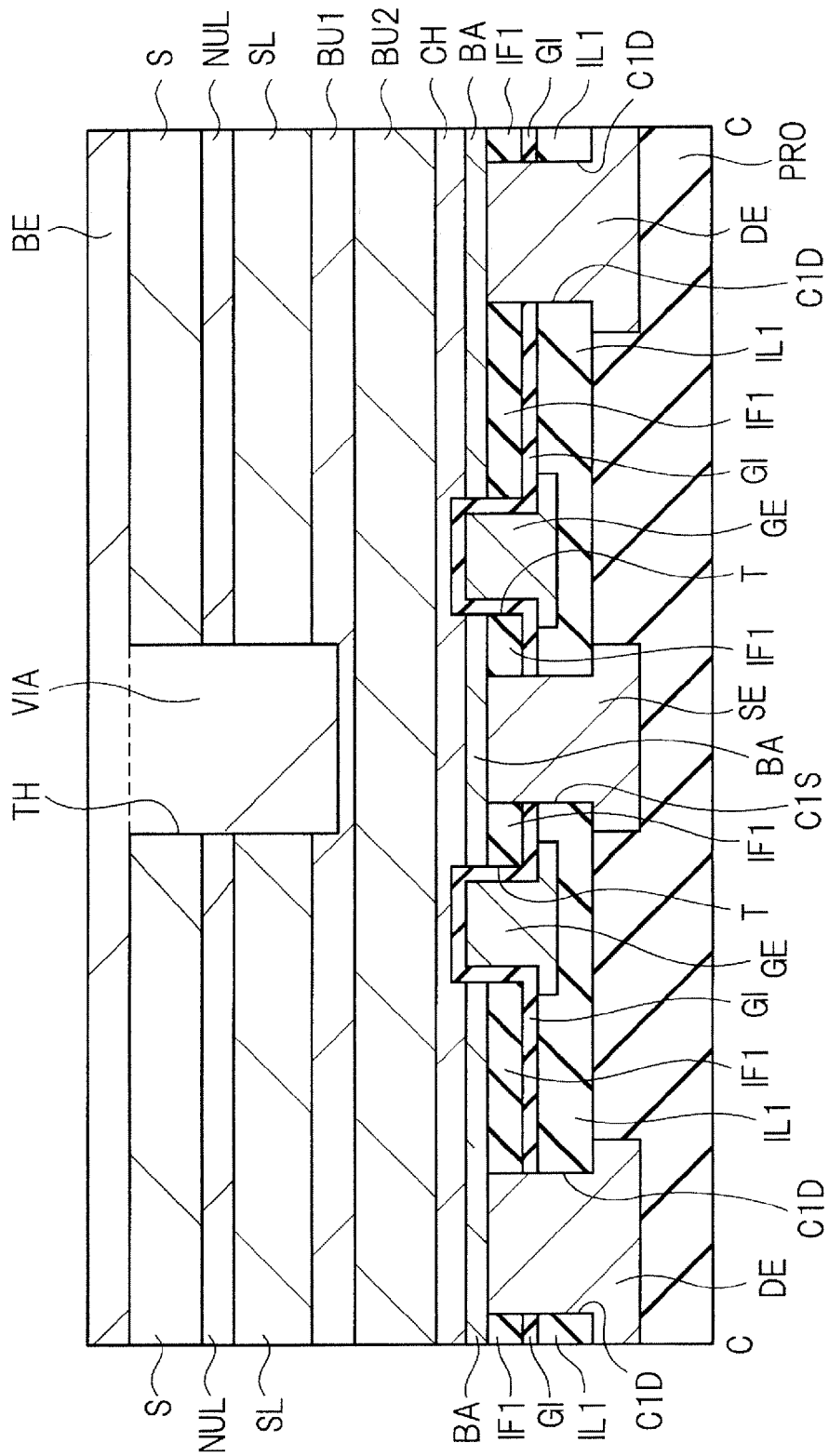
FIG. 28 is a cross-sectional view showing a manufacturing step of the semiconductor device of Third Embodiment following that of FIG. 27.

Next as shown in FIG. 28, a conductive film is formed on the back surface side of the substrate S and also in the through-hole TH. It is formed, for example, through sputtering or the like by using, as the conductive film, a stacked film (Al/TiN) made of a titanium nitride (TiN) film and an aluminum (Al) film lying thereon. The through-hole TH is therefore filled with the conductive film and a coupling portion VIA is formed. In addition, a back-surface electrode BE is formed from the conductive film deposited on the back surface of the substrate S. Thus, the coupling portion VIA is coupled to the back-surface electrode BE and, for example, a ground potential (source potential) is applied to the back-surface electrode BE.

By the steps described above, the semiconductor device of the present embodiment can be manufactured. The above-mentioned steps are however shown as one example and the semiconductor device of the present embodiment may be manufactured by steps other than the above-mentioned steps.
(Another Configuration)

In First Embodiment, the bottom surface of the coupling portion VIA is placed in the middle of the buffer layer BU1, but the bottom surface of the coupling portion VIA may be placed below the bottom surface of the buffer layer BU1.

Figure 29:
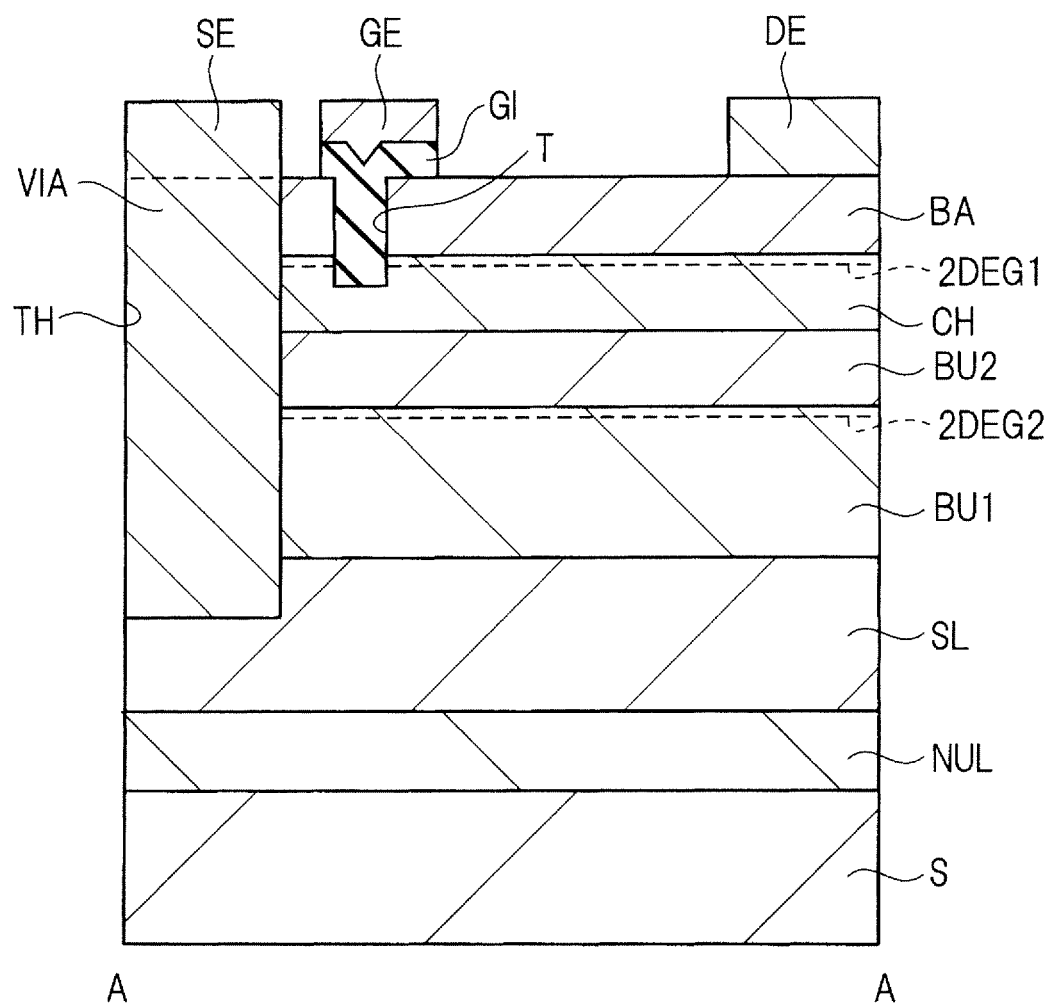
FIG. 29 is a cross-sectional view showing another configuration of First Embodiment.

FIG. 29 is a cross-sectional view showing another configuration of First Embodiment. The configuration other than the coupling portion VIA is similar to First Embodiment, so that a description on it is omitted.

As shown in FIG. 29, the bottom surface of the coupling portion VIA may be placed below the bottom surface of the buffer layer BU1 to bring a portion of the side surface of the coupling portion VIA into contact with the buffer layer BU1.

The coupling portion VIA is formed, for example, by forming a through-hole TH penetrating through the barrier layer BA, the channel layer CH, the buffer layer BU2, and the buffer layer BU1 and reaching the middle of the superlattice layer SL and then filling the through-hole TH with a conductive film.

The bottom surface of the coupling portion VIA of Second Embodiment may be placed below the bottom surface of the buffer layer BU1.

In the above-mentioned embodiments, a GaN layer and an AlGaN layer are given as examples of a nitride semiconductor layer configuring the buffer layer BU1, the buffer layer BU2, the channel layer CH, and the barrier layer BA, but another nitride semiconductor layer may be used.

For example, the GaN layer may be replaced by an InGaN layer or the AlGaN layer may be replaced by an InAlN layer.
(Products to Which Semiconductor Element is Applied)

Although no limitation is imposed on a portion to which the semiconductor element (MISFET) described in the above-mentioned embodiments can be applied, it can be used as a semiconductor element (MISFET) configuring a switched-mode power supply, a PFC circuit, or an inverter. Examples of products using a switched-mode power supply include a server power supply, an interruptible power supply, a power conditioner for photovoltaic generation, and HV·EV power supply. Examples of products using a PFC circuit include various industrial power supplies such as server and motor, domestic power supplies, and adapter power supplies for various mobile devices. Examples of products using an inverter include motor drive power supplies and plug-in HV power supplies.

The invention made by the present inventors has been described specifically based on some embodiments. The present invention is not limited to these embodiments but needless to say, can be changed in various ways without departing from the gist of the invention.

What is claimed is:

1. A semiconductor device, comprising:
   a first nitride semiconductor layer formed over a substrate;
   a second nitride semiconductor layer formed over the first nitride semiconductor layer;
   a third nitride semiconductor layer formed over the second nitride semiconductor layer;
   a fourth nitride semiconductor layer formed over the third nitride semiconductor layer;
   a trench penetrating through the fourth nitride semiconductor layer and reaching the middle of the third nitride semiconductor layer;
   a gate electrode placed in the trench via a gate insulating film; and
   a first electrode and a second electrode formed over the fourth nitride semiconductor layer on both sides of the gate electrode, respectively,
   wherein the fourth nitride semiconductor layer has an electron affinity smaller than that of the third nitride semiconductor layer,
   wherein the third nitride semiconductor layer has an electron affinity greater than that of the second nitride semiconductor layer,
   wherein the second nitride semiconductor layer has an electron affinity smaller than that of the first nitride semiconductor layer, and
   wherein the first electrode is coupled to the first nitride semiconductor layer via a through-hole reaching the first nitride semiconductor layer.

2. The semiconductor device according to claim 1,
   wherein the first electrode has a potential equal to that of the first nitride semiconductor layer.

3. The semiconductor device according to claim 1,
   wherein the potential of each of the first electrode and the first nitride semiconductor layer is a ground potential.

4. The semiconductor device according to claim 1,
   wherein the first electrode is coupled to the first nitride semiconductor layer via a first coupling portion.

5. The semiconductor device according to claim 4,
   wherein the first coupling portion is placed in the through-hole penetrating through the fourth nitride semiconductor layer, the third nitride semiconductor layer, and the second nitride semiconductor layer and reaching the first nitride semiconductor layer.

6. The semiconductor device according to claim 5,
   wherein the first coupling portion has thereover the first electrode.

7. The semiconductor device according to claim 1,
   wherein the second nitride semiconductor layer is an AlGaN layer and the first nitride semiconductor layer is a GaN layer.

8. The semiconductor device according to claim 7,
   wherein the fourth nitride semiconductor layer is an AlGaN layer and the third nitride semiconductor layer is a GaN layer.

9. The semiconductor device according to claim 8,
   wherein the fourth nitride semiconductor layer has an Al content more than that of the second nitride semiconductor layer.

10. The semiconductor device according to claim 7,
wherein the second nitride semiconductor layer has an Al content of 3% or more but not more than 8%.

11. A semiconductor device, comprising:
a first nitride semiconductor layer formed over a substrate;
a second nitride semiconductor layer formed over the first nitride semiconductor layer;
a third nitride semiconductor layer formed over the second nitride semiconductor layer;
a fourth nitride semiconductor layer formed over the third nitride semiconductor layer;
a trench penetrating through the fourth nitride semiconductor layer and reaching the middle of the third nitride semiconductor layer;
a gate electrode placed in the trench via a insulating film; and
a first electrode and a second electrode formed over the fourth nitride semiconductor on both sides of the gate electrode, respectively,
wherein the fourth nitride semiconductor layer has an electron affinity smaller than that of the third nitride semiconductor layer,
wherein the third nitride semiconductor layer has an electron affinity greater than that of the second nitride semiconductor layer,
wherein the second nitride semiconductor layer has an electron affinity smaller than that of the first nitride semiconductor layer,
wherein the first electrode is coupled to the first nitride semiconductor layer,
wherein the substrate has a first region and a second region,
wherein the gate electrode, the first electrode, and the second electrode are formed in the first region,
wherein the second region is an element isolation region formed in the fourth nitride semiconductor layer and the third nitride semiconductor layer,
wherein the first electrode and the first nitride semiconductor layer are coupled to each other via a first coupling portion, and
wherein the first coupling portion is placed in a through-hole penetrating through the element isolation region and the second nitride semiconductor layer and reaching the first nitride semiconductor layer.

12. The semiconductor device according to claim 11,
wherein the first coupling portion has thereover a first terminal portion to be electrically coupled to the first electrode.

13. The semiconductor device according to claim 11,
wherein the second nitride semiconductor layer is an AlGaN layer and the first nitride semiconductor layer is a GaN layer.

14. The semiconductor device according to claim 13,
wherein the fourth nitride semiconductor layer is an AlGaN layer and the third nitride semiconductor layer is a GaN layer.

15. The semiconductor device according to claim 14,
wherein the fourth nitride semiconductor layer has an Al content more than that of the second nitride semiconductor layer.

16. The semiconductor device according to claim 13,
wherein the second nitride semiconductor layer has an Al content of 3% or more but not more than 8%.

17. A semiconductor device, comprising:
a first nitride semiconductor layer formed over a substrate;
a second nitride semiconductor layer formed over the first nitride semiconductor layer;
a third nitride semiconductor layer formed over the second nitride semiconductor layer;
a fourth nitride semiconductor layer formed over the third nitride semiconductor layer;
a trench penetrating through the fourth nitride semiconductor layer and reaching the middle of the third nitride semiconductor layer;
a gate electrode placed in the trench via a gate insulating film;
a first electrode and a second electrode formed over the fourth nitride semiconductor layer on both sides of the gate electrode, respectively, and
a first coupling portion placed in a through-hole starting from the back surface side, which is a lower side, of the substrate, penetrating through the substrate and reaching the first nitride semiconductor layer,
wherein the fourth nitride semiconductor layer has an electron affinity smaller than that of the third nitride semiconductor layer,
wherein the third nitride semiconductor layer has an electron affinity greater than that of the second nitride semiconductor layer, and
wherein the second nitride semiconductor layer has an electron affinity smaller than that of the first nitride semiconductor layer.

18. The semiconductor device according to claim 17,
wherein the first electrode has a potential equal to that of the first nitride semiconductor layer.

19. The semiconductor device according to claim 17,
wherein the fourth nitride semiconductor layer and the second nitride semiconductor layer are each an AlGaN layer and the third nitride semiconductor layer and the first nitride semiconductor layer are each a GaN layer.

20. The semiconductor device according to claim 19,
wherein the fourth nitride semiconductor layer has an Al content greater than that of the second nitride semiconductor layer.

* * * * *